United States Patent
Song et al.

(10) Patent No.: US 8,552,546 B2
(45) Date of Patent: Oct. 8, 2013

(54) SEMICONDUCTOR PACKAGE, SEMICONDUCTOR PACKAGE STRUCTURE INCLUDING THE SEMICONDUCTOR PACKAGE, AND MOBILE PHONE INCLUDING THE SEMICONDUCTOR PACKAGE STRUCTURE

(75) Inventors: In-Sang Song, Seoul (KR); Seok-Keun Lim, Hwaseong-si (KR); In-Wook Jung, Hwaseong-si (KR); Bong-Ken Yu, Hwaseong-si (KR); Sang-Wook Park, Hwaseong-si (KR); Ji-Seok Hong, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 285 days.

(21) Appl. No.: 12/896,091

(22) Filed: Oct. 1, 2010

(65) Prior Publication Data

US 2011/0079890 A1 Apr. 7, 2011

(30) Foreign Application Priority Data

Oct. 6, 2009 (KR) .................... 10-2009-0094832
Apr. 20, 2010 (KR) .................... 10-2010-0036505

(51) Int. Cl.
*H01L 23/48* (2006.01)
*H01L 23/52* (2006.01)

(52) U.S. Cl.
USPC ............ 257/686; 257/777; 257/787; 257/783

(58) Field of Classification Search
USPC .................. 257/686, 777, 787, 790, E23.169
See application file for complete search history.

(56) References Cited

U.S. PATENT DOCUMENTS

| | | | | |
|---|---|---|---|---|
| 6,005,778 A | * | 12/1999 | Spielberger et al. | 361/770 |
| 6,049,094 A | * | 4/2000 | Penry | 257/99 |
| 6,215,193 B1 | * | 4/2001 | Tao et al. | 257/777 |
| 6,239,366 B1 | * | 5/2001 | Hsuan et al. | 174/529 |
| 6,359,340 B1 | * | 3/2002 | Lin et al. | 257/777 |
| 6,744,141 B2 | * | 6/2004 | Kimura | 257/777 |
| 6,858,938 B2 | | 2/2005 | Michii | |
| 6,900,528 B2 | * | 5/2005 | Mess et al. | 257/686 |
| 7,498,667 B2 | * | 3/2009 | Ha et al. | 257/686 |
| 7,683,467 B2 | * | 3/2010 | Jang et al. | 257/686 |
| 7,692,279 B2 | * | 4/2010 | Karnezos et al. | 257/686 |
| 7,859,119 B1 | * | 12/2010 | St. Amand et al. | 257/777 |

(Continued)

FOREIGN PATENT DOCUMENTS

| | | |
|---|---|---|
| JP | 2004071947 A | 3/2004 |
| KR | 10-2001-0025874 A | 4/2001 |
| KR | 10-2004-0014156 A | 2/2004 |

*Primary Examiner* — Nitin Parekh
(74) *Attorney, Agent, or Firm* — Harness, Dickey & Pierce, P.L.C.

(57) ABSTRACT

Provided is a semiconductor package. The semiconductor package may include a first semiconductor package having first semiconductor chips sequentially stacked on a substrate. In example embodiments, the first semiconductor chips may have a cascaded arrangement in which first sides and second sides of the semiconductor chips define cascade patterns. The cascaded arrangement may extend in a first direction to define a space between the first sides of the first semiconductor chips and the substrate. The semiconductor package may also include at least one first connection wiring at the second sides of the semiconductor chips, the at least one first connection wiring being configured to electrically connect the substrate with the first semiconductor chips. In addition, the semiconductor package may further include a first filling auxiliary structure adjacent to the first sides of the first semiconductor chips.

19 Claims, 20 Drawing Sheets

(56) References Cited

U.S. PATENT DOCUMENTS

| | | |
|---|---|---|
| 2004/0026789 A1 | 2/2004 | Michii |
| 2004/0053442 A1* | 3/2004 | Akram et al. ................. 438/106 |
| 2004/0262774 A1* | 12/2004 | Kang et al. .................... 257/777 |
| 2005/0156323 A1* | 7/2005 | Tokunaga ..................... 257/778 |
| 2007/0170572 A1 | 7/2007 | Liu et al. |
| 2008/0150158 A1* | 6/2008 | Chin ............................. 257/777 |
| 2009/0108470 A1* | 4/2009 | Okada et al. .................. 257/777 |
| 2009/0236754 A1* | 9/2009 | Yang et al. .................... 257/777 |
| 2010/0148331 A1* | 6/2010 | Mess et al. .................... 257/676 |

* cited by examiner

SEMICONDUCTOR PACKAGE, SEMICONDUCTOR PACKAGE STRUCTURE INCLUDING THE SEMICONDUCTOR PACKAGE, AND MOBILE PHONE INCLUDING THE SEMICONDUCTOR PACKAGE STRUCTURE

CROSS-REFERENCE TO RELATED APPLICATION

This application claims priority under 35 U.S.C. §119 to Korean Patent Application No. 10-2009-0094832, filed on Oct. 6, 2009, in the Korean Intellectual Property Office (KIPO) and Korean Patent Application No. 10-2010-0036505, filed on Apr. 20, 2010, in the Korean Intellectual Property Office (KIPO), the contents of each are hereby incorporated by reference in their entirety.

BACKGROUND

1. Field

Example embodiments relate to a semiconductor package, a semiconductor package structure including the semiconductor package, and a mobile phone including the semiconductor package structure.

2. Description of Related Art

In recent years, a semiconductor package structure has come to include semiconductor chips which are sequentially stacked on a substrate for high integration. The semiconductor chips have become thinner and thinner in thickness in response to a trend toward the high integration. The semiconductor chips may be disposed on the substrate such that both sides of the semiconductor chips are exposed. The semiconductor chips may have a convex portion at one side and a concave portion at the other side. The convex portion may have an inverse shape to the concave portion. The semiconductor chips may be electrically connected with the substrate via connection wirings at the one side thereof.

A filling structure may be disposed on the substrate, the semiconductor chips, and the connection wirings. The filling structure may be also disposed on the convex and concave portions of the semiconductor chips. The filling structure may include resin and fillers. In this case, the filling structure may not sufficiently fill the concave portion of the semiconductor chips. This is because a diameter of each of the fillers may be larger than a thickness of the semiconductor chips. Therefore, the filling structure may form a void in the concave portion of the semiconductor chips.

The semiconductor chips may be inclined toward the substrate around the void due to physical pressure of the filling structure or external pressure. A part of the semiconductor chips may not be electrically connected with the substrate via the connection wirings. The filling structure cannot be temporarily changed in response to the trend toward the high integration of the semiconductor chips. A change in the filling structure may increase a manufacturing cost of the semiconductor package structure. Besides, sides of the part of the semiconductor chips may not be physically supported from adjacent semiconductor chips of the part.

Pressure from a unit for supplying a conductive material may be applied to the sides of the semiconductor chips and on the substrate. The unit for supplying the conductive material may include a capillary or a wedge tool. The unit for supplying the conductive material may provide the connection wirings on the one side of the semiconductor chips, and the substrate. In this case, the pressure of the unit for supplying the conductive material may cause cracks in the sides of the part of the semiconductor chips.

The cracks in the semiconductor chips may deteriorate physical characteristics and/or electrical characteristics of the semiconductor package structure. The semiconductor package structure may be disposed in processor-based systems and/or mobile phones. The processor-based systems and/or mobile phones may not sufficiently store desired data in the semiconductor package structure due to voids and/or cracks in the semiconductor package structure.

SUMMARY

Example embodiments provide a semiconductor package in which concave portions around semiconductor chips may be sufficiently filled when the semiconductor chips have cascade shapes at both sides thereof.

Example embodiments also provide a semiconductor package structure capable of preventing cracks from occurring at least one side of semiconductor chips which form cascade shapes.

Example embodiments also provide a mobile phone in which desired data can be sufficiently stored in a semiconductor package structure.

Example embodiments are directed to a semiconductor package that may include at least one filling auxiliary structure at least one side of the semiconductor chips, a semiconductor package structure and a mobile phone.

In accordance with example embodiments, a semiconductor package may include a first semiconductor package having first semiconductor chips sequentially stacked on a substrate. In example embodiments, the first semiconductor chips may have a cascaded arrangement in which first sides and second sides of the semiconductor chips define cascade patterns. The cascaded arrangement may extend in a first direction to define a space between the first sides of the first semiconductor chips and the substrate. The semiconductor package may also include at least one first connection wiring at the second sides of the semiconductor chips, the at least one first connection wiring being configured to electrically connect the substrate with the first semiconductor chips. In addition, the semiconductor package may further include a first filling auxiliary structure adjacent to the first sides of the first semiconductor chips.

In accordance example embodiments, a semiconductor package may include semiconductor chips, at least one connection wiring and a filling auxiliary structure. The semiconductor chips may be sequentially stacked on a substrate and may have cascade shapes at both sides thereof, respectively. The semiconductor chips may define a space at a selected side of both sides thereof together with the substrate. The at least one connection wiring may be disposed at the other side of the both sides of the semiconductor chips to electrically connect the substrate with the semiconductor chips. The filling auxiliary structure may be disposed around the other side of the semiconductor chips.

In example embodiments, the filling auxiliary structure may be disposed at the selected side and may partially fill the space.

In example embodiments, the filling auxiliary structure may be disposed at the selected side and may sufficiently fill the space.

In example embodiments, the filling auxiliary structure may have an inclined corner in at least one of selected semiconductor chips which form a cascade shape at the selected side and are separated from the substrate.

In example embodiments, the filling auxiliary structure may have an opening cross sectional surface of a hole which passes through selected semiconductor chips which form a cascade shape at the selected side and are separated from the substrate.

In example embodiments, the filling auxiliary structure may be disposed below the semiconductor chips and have a substantially constant thickness.

In example embodiments, the filling auxiliary structure may be disposed below the semiconductor chips and may have a shape which is tapered toward the other side of the semiconductor chips from the selected side of the semiconductor chips.

In accordance with example embodiments, a semiconductor package structure may include a first semiconductor package and a second semiconductor package. The first semiconductor package may include first semiconductor chips, a first filling auxiliary structure and at least one first connection wiring. The first semiconductor chips may be sequentially stacked on a substrate and have cascade shapes in a first direction at both sides thereof. The first filling auxiliary structure may be in contact with the first semiconductor chips through one side of the first semiconductor chips. The at least one first connection wiring may be disposed at the other side of the first semiconductor chips and be in contact with the substrate and the first semiconductor chips.

The second semiconductor package may be disposed on the first semiconductor package and may include second semiconductor chips and a second filling auxiliary structure. The second semiconductor chips may have cascade shapes in a second direction at both sides thereof. The second filling auxiliary structure may be disposed on the other side of the first semiconductor chips and may be in contact with the first and second semiconductor chips.

In example embodiments, the second semiconductor chips may protrude from the first semiconductor package at both sides of the first semiconductor chips.

In example embodiments, the first direction may make an angle smaller than 90° with respect to a surface of the substrate. An angle between the first direction and the second direction may be smaller than 180°. The first and second semiconductor packages may have a first groove disposed on the other side of the first semiconductor chips and defined by the first and second semiconductor chips. The second filling auxiliary structure may partially or sufficiently fill the groove.

In example embodiments, the semiconductor package structure may further include at least one second connection wiring. The at least one second connection wiring may constitute the second semiconductor package, be disposed over the one side of the first semiconductor chips and may be in contact with the substrate and the second semiconductor chips. The at least one first connection wiring may be partially covered by the second filling auxiliary structure. The at least one second connection wiring may be disposed over the first filling auxiliary structure.

In example embodiments, the semiconductor package structure may further at least include a third semiconductor package on the second semiconductor package. The third semiconductor package may include third semiconductor chips and a third filling auxiliary structure. The third semiconductor chips may have cascade shapes extending to the same direction as the first semiconductor chips at both sides thereof. The second and third semiconductor chips may have a second groove on the one side of the first semiconductor chips. The third filling auxiliary structure may partially cover the at least one second connection wiring and partially or sufficiently fill the second groove.

In example embodiments, the semiconductor package structure may further include a filling structure disposed on the substrate. When the first filling auxiliary structure is composed as one body and the second and third filling auxiliary structures sufficiently fill the first and second grooves, the first filling auxiliary structure may contact along the cascade shape of the one side of the first semiconductor chips. The filling structure may cover the first to third semiconductor packages.

In example embodiments, the semiconductor package structure may further include a filling structure disposed on the substrate. When the first filling auxiliary structure is composed of a plurality of supporting members disposed parallel with respect to the working surface of the substrate and the second and third filling auxiliary structures partially fill the first and second grooves, the first filling auxiliary structure may partially expose the cascade shape of the one side of the first semiconductor chips through the plurality of supporting members. The filling structure may fill between the supporting members, the second and third filling auxiliary members, and the first to third semiconductor chips and cover the first to third semiconductor packages.

In example embodiments, the semiconductor package structure may further include adhesive members over the substrate. The adhesive members may be disposed between the substrate and the first to third semiconductor chips. The adhesive members may be composed of a chemically stable material which is non reactive to the filling structure and the first to third filling auxiliary structures. Each of the second and third filling auxiliary structures may include at least one supporting member.

In example embodiments, a mobile phone, may include a driving unit and a memory card. The driving unit may be electrically connected with the memory card. The memory card may include a semiconductor package which includes semiconductor chips, at least one connection wiring and a filling auxiliary structure.

The semiconductor chips may be sequentially stacked on a substrate and may have cascade shapes at both sides thereof, respectively. The semiconductor chips may define a space at a selected side of both sides of the semiconductor chips together with the substrate. The at least one connection wiring may be disposed at the other side of the both sides of the semiconductor chips and electrically connect the substrate with the semiconductor chips. The filling auxiliary structure may be disposed around the other side of the semiconductor chips.

In example embodiments, the driving unit may include a baseband module, a camera module, an LCD module, a memory system, a multimedia module, and an RF module which are electrically connected with each other.

In example embodiments, the filling auxiliary structure may be disposed at the selected side to partially or sufficiently fill the space.

In example embodiments, the filling auxiliary structure may have a cascade shape at the selected side and have an opening cross sectional surface of a hole which passes through selected semiconductor chips separated from substrate.

In example embodiments, the filling auxiliary structure may be disposed below the semiconductor chips and have a substantially constant thickness, or may be disposed below the semiconductor chips and have a shape which is tapered toward the other side of the semiconductor chips from the selected side of the semiconductor chips.

BRIEF DESCRIPTION OF THE DRAWINGS

The foregoing and other features and advantages of example embodiments will be apparent as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION OF EXAMPLE EMBODIMENTS

Figure 1:
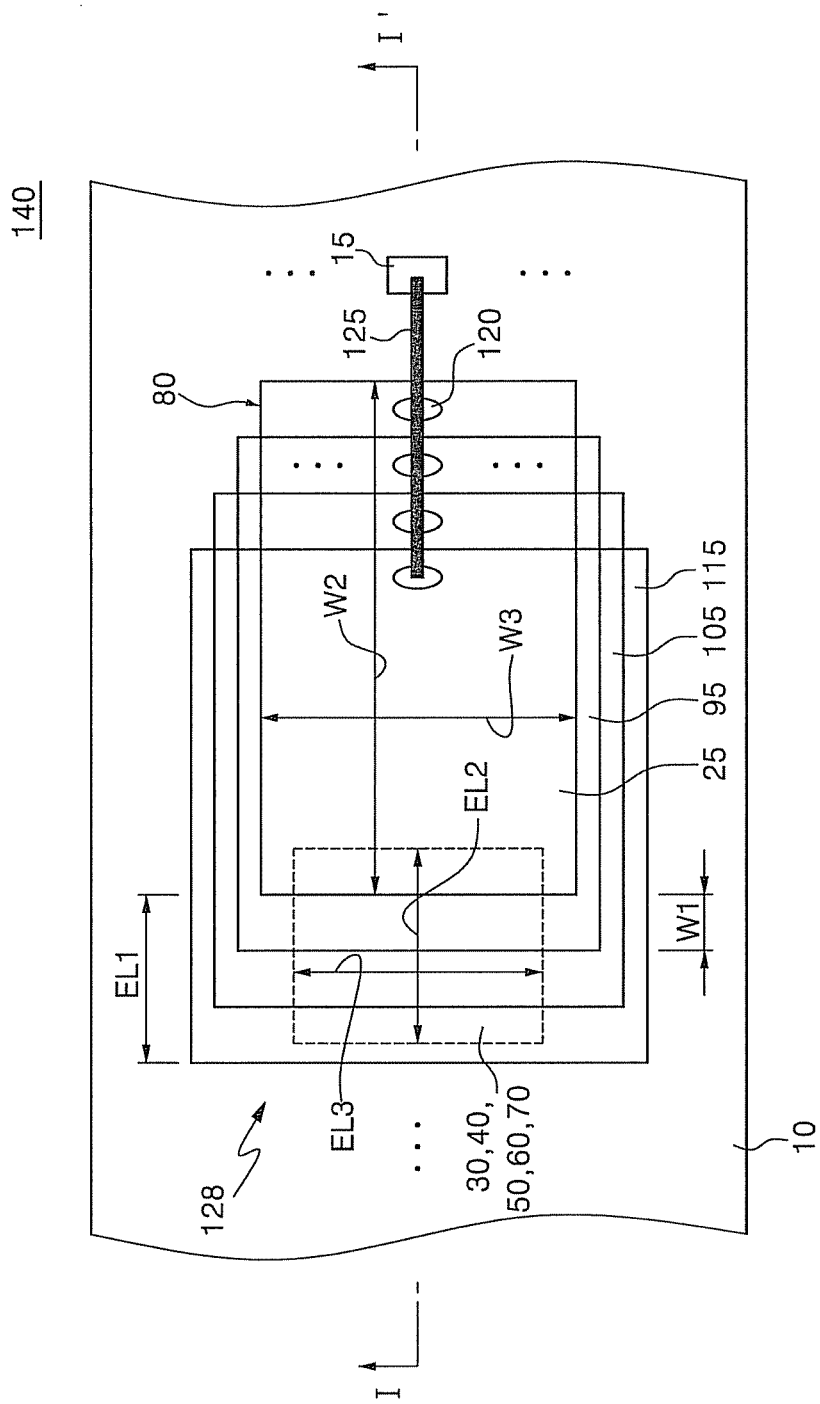
FIG. 1 is a plan view of a semiconductor package structure according to example embodiments.

Example embodiments will now be described more fully with reference to the accompanying drawings in which example embodiments are shown. Example embodiments may, however, be embodied in different forms and should not be construed as limited to example embodiments set forth herein. Rather, example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A semiconductor package structure having one semiconductor package on a substrate and a method of forming the same according to example embodiments will be described with reference to FIGS. 1 to 10.

The semiconductor package structure according to example embodiments will be described in detail with reference to FIGS. 1 and 2.

FIG. 1 is a plan view of a semiconductor package structure according to example embodiments.

Referring to FIG. 1, a semiconductor package structure 140 may include a semiconductor package 128 on a substrate 10. The semiconductor package 128 may include first to fourth semiconductor chips 25, 95, 105, and 115. The substrate 10 may have at least one base pad 15. The first to fourth semiconductor chips 25, 95, 105, and 115 may be arranged to expose the at least one base pad 15 at a selected side of either side thereof. The first to fourth semiconductor chips 25, 95, 105, and 115 may be arranged expose the first to third semiconductor chips 25, 95, and 105 at the selected side thereof.

The second semiconductor chip 95 may protrude from the remaining side of the first semiconductor chip 25 by a predetermined width W1 or another width. The third semiconductor chip 105 may protrude from the remaining side of the second semiconductor chip 95 by the predetermined width W1 or another width. The fourth semiconductor chip 115 may protrude from the remaining side of the third semiconductor chip 105 by the predetermined width W1 or another width. The first to fourth semiconductor chips 25, 95, 105, and 115 may have different overlap shapes at the either side along line I-I'.

The fourth semiconductor chip 115 may protrude from the remaining side of the first semiconductor chip 25 by a length EL1 that may or may not be predetermined. The first to fourth semiconductor chips 25, 95, 105, and 115 may have the substantially same horizontal width W2 and vertical width W3 as each other. The first to fourth semiconductor chips 25, 95, 105, and 115 may have different horizontal widths and vertical widths from each other. The first to fourth semiconductor chips 25, 95, 105, and 115 may have the substantially same area as each other or different areas from each other. The first to fourth semiconductor chips 25, 95, 105, and 115 may be replaced with a different number of stacked semiconductor chips.

The first to fourth semiconductor chips 25, 95, 105, and 115 each may have at least one connection pad 120. At least one connection wiring 125 may be disposed on the at least one connection pad 120. The at least one connection wiring 125 may extend to the at least one base pad 15. The at least one connection wiring 125 may electrically connect the substrate 10 with the first to fourth semiconductor chips 25, 95, 105, and 115. The at least one connection wiring 125 may include a plurality of wires.

A filling auxiliary structure 30, 40, 50, 60, 70, or 80 may be disposed around the remaining side of the first to fourth semiconductor chips 25, 95, 105, and 115 as illustrated in FIG. 5, 6, 7, 8, 9, or 10. The filling auxiliary structure 30, 40, 50, 60, or 70 may be disposed on the selected side of the first to fourth semiconductor chips 25, 95, 105, and 115 as illustrated in FIG. 5, 6, 7, 8, or 9. The filling auxiliary structure 30, 40, 50, 60, or 70 may have a horizontal width EL2 which may be substantially equal to or smaller than the protruding length EL1 by which the fourth semiconductor chip 115 protrudes from the other side of the first semiconductor chip 25.

Figure 10:
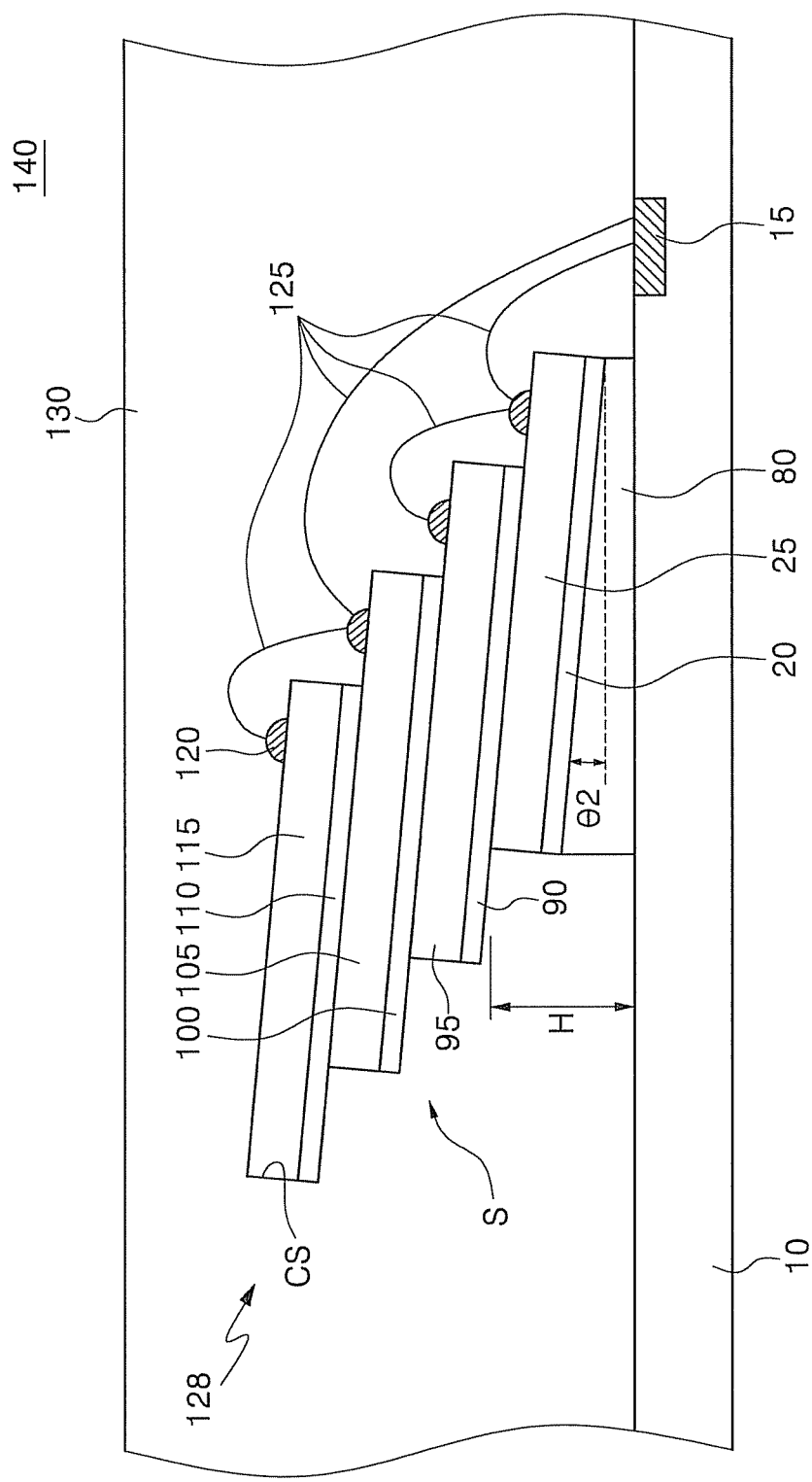
FIG. 10 is a cross-sectional view taken along line I-I' of FIG. 1 illustrating a method of forming a semiconductor package structure according to example embodiments.

The filling auxiliary structure 30, 40, 50, 60, or 70 may have a vertical width EL3 which may be substantially equal to the vertical, width W3 of the first semiconductor chip 25. The filling auxiliary structure 80 may be disposed below the first to fourth semiconductor chips 25, 95, 105, and 115 as illustrated in FIG. 10.

Figure 2:
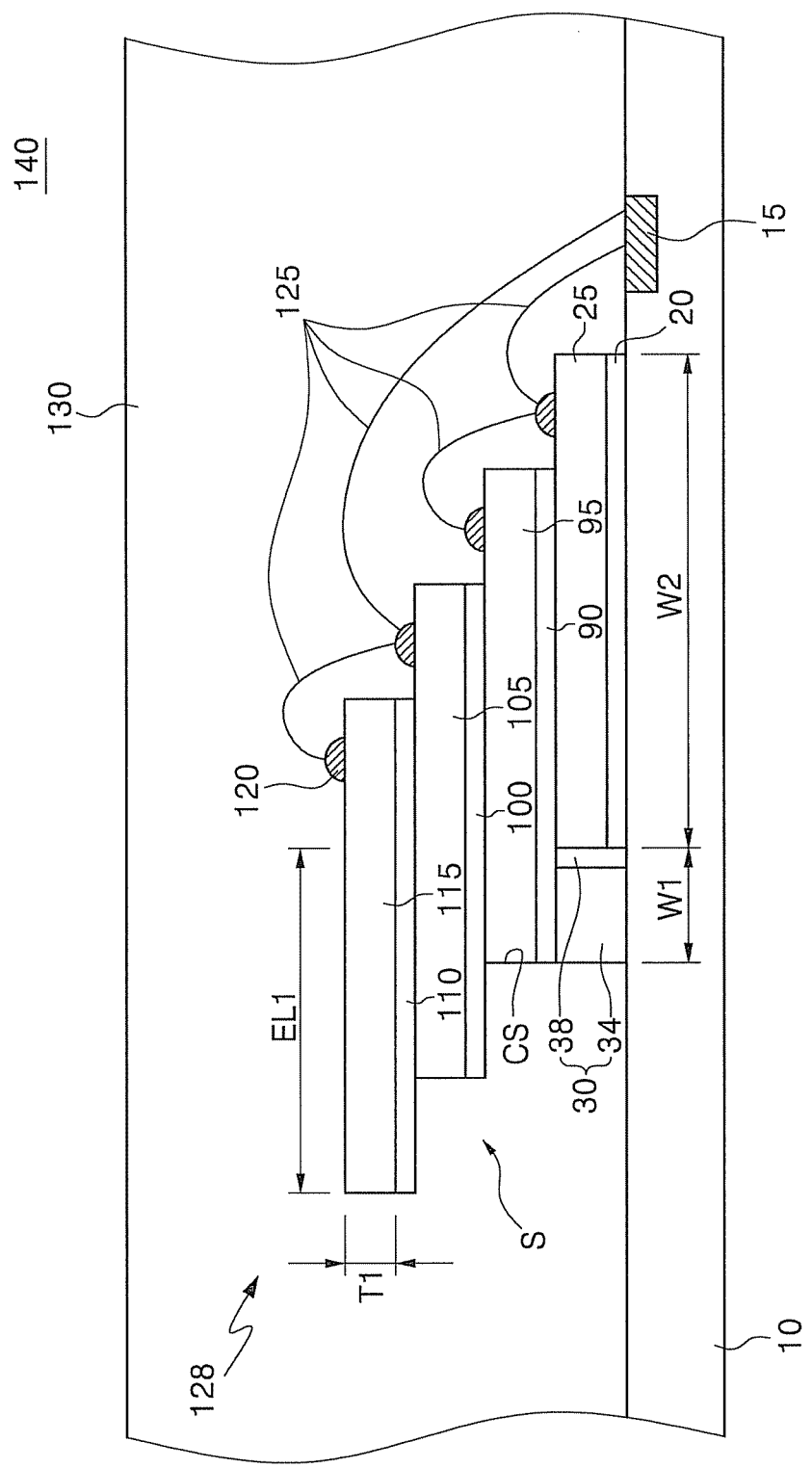
FIG. 2 is a cross-sectional view of semiconductor package structure taken along line I-I' of FIG. 1.

FIG. 2 is a cross-sectional view of a semiconductor package structure taken along line I-I' of FIG. 1.

Referring to FIG. 2, a semiconductor package structure 140 may include a semiconductor package 128. The semiconductor package 128 may include the first to fourth semiconductor chips 25, 95, 105, and 115. In example embodiments, the left sides of the semiconductor chips 25, 95, 105 and 115 may be considered first sides of the semiconductor chips 25, 95, 105 and 115 and the right sides of the semiconductor chips 25, 95, 105 and 115 may be considered the second sides of the semiconductor chips 25, 95, 105 and 115. The second to fourth semiconductor chips 95, 105, and 115 may protrude from the sides of the first to third semiconductor chips 25, 95, and 105 by about the same width W1 as illustrated in FIG. 1. The first to fourth semiconductor chips 25, 95, 105, and 115 may have cascade shapes CS at both sides thereof. The cascade shapes CS may have a convex portion which is defined at a selected side of the both sides along the first to third semiconductor chips 25, 95, and 105 which are disposed at a relatively low position among the first to fourth semiconductor chips 25, 95, 105, and 115.

The cascade shapes CS may have a concave portion which is defined at the remaining side of the both sides along the first to third semiconductor chips 25, 95, and 105 which may be disposed at a relatively low position among the first to fourth semiconductor chips 25, 95, 105, and 115. The fourth semiconductor chip 115 may protrude from the other side of the first semiconductor chip 25 by the predetermined length EL1. The cascade shapes CS may have substantially the same trajectory or different trajectories at a selected level. The cascade shapes may expose surfaces between the first to fourth semiconductor chips 25, 95, 105, and 115 which face each other. In other words, the left sides (first sides) of the first to fourth semiconductor chips 25, 95, 105, and 115 may form a cascade pattern CS and the right side (second sides) of the first to fourth semiconductor chips 25, 95, 105, and 115 may likewise form a cascade pattern.

Each of the first to fourth semiconductor chips 25, 95, 105, and 115 may have the at least one connection pad 120. The first to fourth semiconductor chips 25, 95, 105, and 115 may have substantially the same horizontal width W2 as illustrated in FIG. 1. The first to fourth semiconductor chips 25, 95, 105, and 115 may have substantially the same thickness T1 or different thicknesses. The substrate 10 may be disposed under the first to fourth semiconductor chips 25, 95, 105, and 115. The substrate 10 may include a printed circuit board (PCB). The substrate 10 may define a space S at the other side of the first to fourth semiconductor chips 25, 95, 105, and 115 together with the first to fourth semiconductor chips 25, 95, 105, and 115. In example embodiments the space S may be cave-like. In other words, the left sides (first sides) of the first to fourth semiconductor chips 25, 95, 105, and 115 may form the space S along with the substrate 10.

The substrate 10 may include the at least one base pad 15. The semiconductor package 128 may include first to fourth adhesive members 20, 90, 100, and 110. The first to fourth adhesive members 20, 90, 100, and 110 may be disposed between the substrate 10 and the first to fourth semiconductor chips 25, 95, 105, and 115. The first to fourth adhesive members 20, 90, 100, and 110 may have a width which is equal to or different from the horizontal width W2 of the first to fourth semiconductor chips 25, 95, 105, and 115. The semiconductor package 128 may include at least one connection wiring 125. The at least one connection wiring 125 may be disposed at the selected side of the first to fourth semiconductor chips 25, 95, 105, and 115. In other words, the at least one connection wiring 125 may be disposed near the right sides (second sides) of the first to fourth semiconductor chips 25, 95, 105, and 115, and may be connected to the first to fourth semiconductor chips 25, 95, 105, and 115.

The at least one connection wiring 125 may include a plurality of wires. The at least one connection wiring 125 may connect the at least one base pad 15 with the at least one connection pad 120 of the first to fourth semiconductor chips 25, 95, 105, and 115. The at least one connection wiring 125 may electrically connect the substrate 10 with the first to fourth semiconductor chips 25, 95, 105, and 115. The semiconductor package 128 may include a filling auxiliary structure 30. The filling auxiliary structure 30 may be disposed at the remaining side of the first to fourth semiconductor chips 25, 95, 105, and 115. The filling auxiliary structure 30 may include a filling member 34 and/or a filling adhesive 38.

The filling member 34 and/or the filling adhesive 38 may partially fill the space S at the remaining side of the first to fourth semiconductor chips 25, 95, 105, and 115. When the first and second adhesive members 20 and 90 have the same horizontal width W2 as the first and second semiconductor chips 25 and 95, the filling structure 34 and/or the filling adhesive 38 may contact the first adhesive member 20, the semiconductor chip 25, and the second adhesive member 90. When the first and second adhesive members 20 and 90 have a width different from the first and second semiconductor chips 25 and 95, the filling member 34 and/or the filling adhesive 38 may contact the first adhesive member 20, the first semiconductor chip 25, and the second semiconductor chip 95.

A filling structure 130 may be disposed on the substrate 10 and the first to fourth semiconductor chips 25, 95, 105, and 115. The filling structure 130 may be disposed on the concave and convex portions of the first to fourth semiconductor chips 25, 95, 105, and 115. The filling structure 130 may cover the at least one connection wiring 125. In example embodiments, the filling structure 130 may be adjacent to the left sides (first sides) of at least one of the first to fourth semiconductor chips 25, 95, 105, and 115.

Although example embodiments illustrate a semiconductor package structure 140 having first to fourth semiconductor chips 25, 95, 105, and 115 connected to a substrate 10 via the connection wiring 125, example embodiments are not limited thereto. For example, the first to fourth semiconductor chips 25, 95, 105, and 115 may be fabricated with metal vias and interconnects to connect each of the first to fourth semiconductor chips 25, 95, 105, and 115 to one another and to the substrate 10.

For example, FIG. 2 shows the first to fourth semiconductor chips 25, 95, 105, and 115 each having a connection pad 120. However, rather than having connection pads 120 connecting to connection wirings 125, the chips may be provided with metal vias passing therethrough at regions corresponding to regions of below the connection pads 120. Furthermore, metal interconnects may be provided on the top surfaces of the semiconductor chips 25, 95, 105, and 115 to connect adjacent semiconductor chips 25, 95, 105, and 115. For example, the third semiconductor chip 105 could include a metal interconnect on a top surface thereof to connect a bottom surface of a via in the fourth semiconductor chip 115 to a top surface of a via of the third semiconductor chip 105. Similarly, the second semiconductor chip 95 could include a metal interconnect on a top surface thereof to connect a bottom surface of a via in the third semiconductor chip 105 to a top surface of a via of the second semiconductor chip 95. Likewise, the first semiconductor chip 25 could include a metal interconnect on a top surface thereof to connect a bottom surface of a via in the second semiconductor chip 95 to a top surface of a via of the first semiconductor chip 25. Additionally, rather than offsetting base pad 15 from the semiconductor package structure 140, the base pad 15 could be provided underneath the semiconductor package structure 140. For example, in the event the first semiconductor chip 25 is formed with a metal via as described above, the base pad 15 could be provided directly underneath the first semiconductor chip's 25 via.

Next, a method of forming a semiconductor package structure according to example embodiments will be described with reference to FIGS. 3 to 10.

Figure 3:
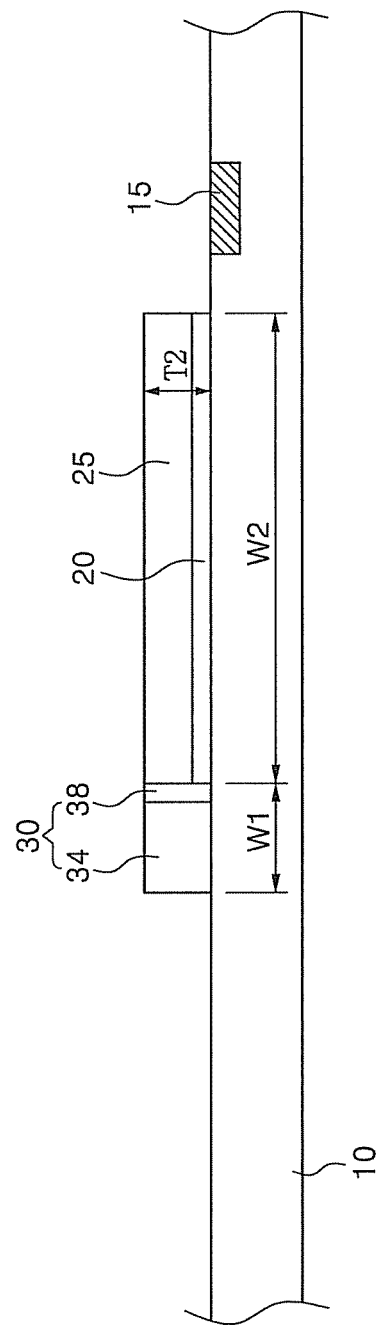
FIGS. 3 to 5 are cross-sectional views taken along line I-I of FIG. 1 illustrating a method of forming a semiconductor package structure according to example embodiments.
Figure 4:
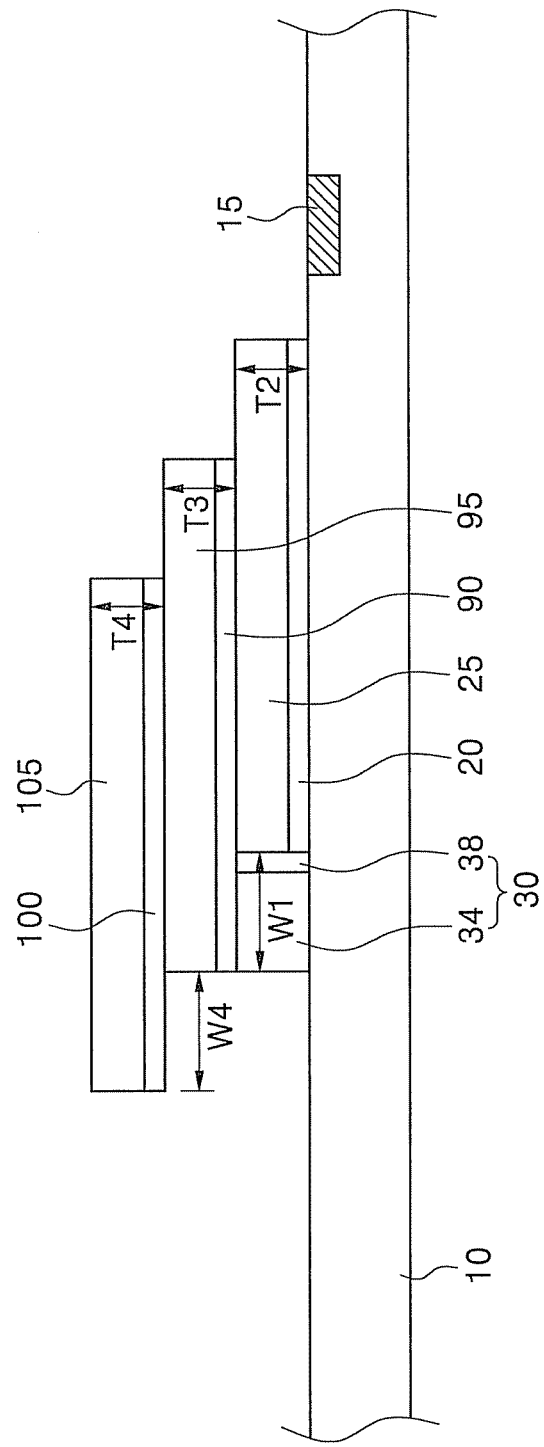
Figure 5:
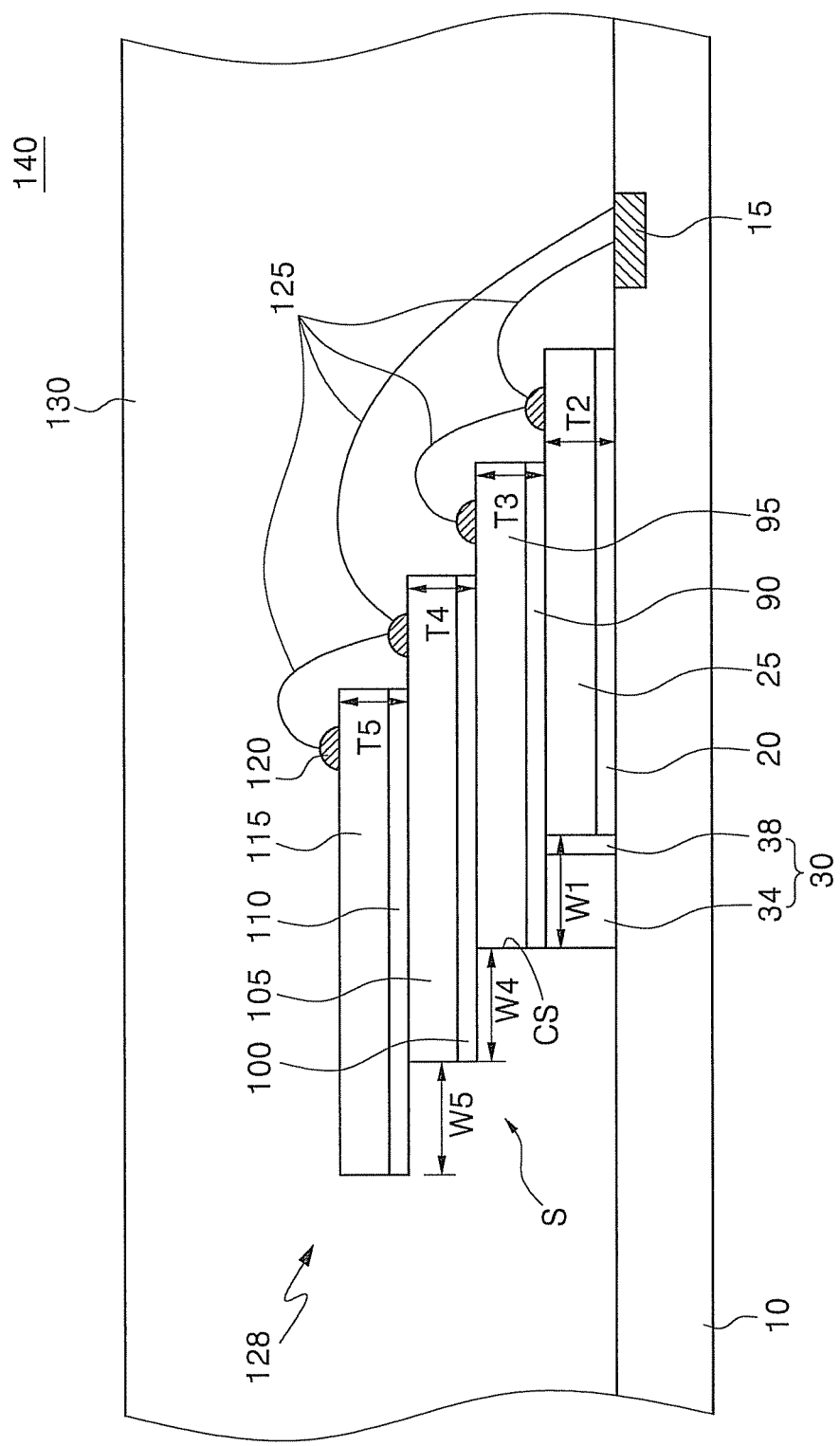

FIGS. 3 to 5 are cross-sectional views taken along line I-I' of FIG. 1 illustrating a method of forming a semiconductor package structure according to example embodiments. FIGS. 3 and 5 uses like reference numerals for like members as shown in FIG. 2.

Referring to FIG. 3, the substrate 10 may be prepared according to example embodiments. The substrate 10 may include a PCB. The substrate 10 may include a desired electric circuit. The substrate 10 may be flexible or non-flexible. The substrate 10 may include the at least one base pad 15. The at least one base pad 15 may be connected with an electric circuit of the substrate. The at least one base pad 15 may include a conductive material. A first adhesive member 20 and a first semiconductor chip 25 may be sequentially formed on the substrate 10.

The first adhesive member 20 and the first semiconductor chip 25 may be formed to expose the at least one base pad 15 through a selected side of both sides thereof. The first adhesive member 20 and the first semiconductor chip 25 may have a thickness T2 that may or may not be predetermined. The first adhesive member 20 may have insulating properties. The first semiconductor chip 25 may include a volatile or non-volatile memory device. The first adhesive member 20 and the first semiconductor chip 25 may have a horizontal width W2 as illustrated in FIG. 1. A filling auxiliary structure 30 may be formed on the remaining side of the first adhesive member 20 and the first semiconductor chip 25.

The filling auxiliary structure 30 may be formed on the substrate 10 to contact the first adhesive member 20 and the first semiconductor chip 25. The filling auxiliary structure 30 may have a width W1 as illustrated in FIG. 1. In example embodiments, the width W1 may or may not be predetermined. The filling auxiliary structure 30 may have the substantially same thickness T2 as the first adhesive member 20 and the first semiconductor chip 25. The filling auxiliary structure 30 may include a filling member 34 and/or a filling adhesive 38. The filling member 34 may include silicon or a material other than the silicon. The filling adhesive 38 may include the same material as the first adhesive member 20.

Referring to FIG. 4, a second adhesive member 90 and a second semiconductor chip 95 may be sequentially formed on the first semiconductor chip 25 and the filling auxiliary structure 30. The second adhesive member 90 and the second semiconductor chip 95 may be foil led to expose the first semiconductor chip 25 through a selected side thereof. The second adhesive member 90 and the second semiconductor chip 95 may protrude from the remaining side of the first adhesive member 20 and the first semiconductor chip 25 by the width W1 of the filling auxiliary structure 30. The second adhesive member 90 and the second semiconductor chip 95 may have a thickness T3 that may or may not be substantially the same as the thickness T2 of the first adhesive member 20 and the first semiconductor chip 25.

The second adhesive member 90 and the second semiconductor chip 95 may cover the filling auxiliary structure 30 at the remaining side thereof. The second adhesive member 90 may include the same material as the first adhesive member 20. The second semiconductor chip 95 may include a device that is the same as or different from the first semiconductor chip 25. A third adhesive member 100 and a third semiconductor chip 105 may be sequentially formed on the second semiconductor chip 95. The third adhesive member 100 and the third semiconductor chip 105 may be formed to expose the second semiconductor chip 95 at a selected side thereof.

The third adhesive member 100 and the third semiconductor chip 105 may have a thickness T4 that may or may not be substantially the same as the thickness T2 of the first adhesive member 20 and the first semiconductor chip 25. The third adhesive member 100 and the third semiconductor chip 105 may protrude from the remaining side of the second adhesive member 90 and the second semiconductor chip 95 by the width W4 that may or may not be the same as the width W1 of the filling auxiliary structure 30. The third adhesive member 100 and the third semiconductor chip 105 may expose the first and second semiconductor chips 25 and 95 together at the selected side thereof. The third adhesive member 100 may include the same material as the second adhesive member 90. The third semiconductor chip 105 may include a device that may be the same as or different from the second semiconductor chip 95.

Referring to FIG. 5, a fourth adhesive member 110 and a fourth semiconductor chip 115 may be sequentially formed on the third semiconductor chip 105. The fourth adhesive member 110 and the fourth semiconductor chip 115 may have a thickness T5 that may or may not be substantially the same as the thickness T2 of the first adhesive member 20 and the first semiconductor chip 25. The fourth adhesive member 110 and the fourth semiconductor chip 115 may be formed to expose the third semiconductor chip 105 at a selected side thereof. The fourth adhesive member 110 and the fourth semiconductor chip 115 may protrude from the remaining side of the third adhesive member 100 and the third semiconductor chip 105 by the width W5 that may or may not be the same as the width W1 of the filling auxiliary structure 30.

The fourth adhesive member 110 may include the same material as the third adhesive member 100. The fourth semiconductor chip 115 may include a device that may or may not be the same as the second semiconductor chip 105. The first to fourth adhesive members 20, 90, 100, and 110 and the first to fourth semiconductor chips 25, 95, 105, and 115 may have cascade shapes CS at both sides thereof. The cascade shapes CS are denoted by a bold line. The first to fourth adhesive members 20, 90, 100, and 110 and the first to fourth semiconductor chips 25, 95, 105, and 115 may define a space S at the remaining side thereof together with the substrate 10.

The first to fourth adhesive members 20, 90, 100, and 110 and the first to fourth semiconductor chips 25, 95, 105, and 115 may be parallel to the substrate 10 due to the filling auxiliary structure 30 without being inclined toward the substrate 10. At least one connection pad 120 may be formed on each of the first to fourth semiconductor chips 25, 95, 105, and 115. The at least one connection pad 120 may include a conductive material. The at least one connection pad 120 may be a selected component of each of the first to fourth semiconductor chips 25, 95, 105, and 115.

At least one connection wiring 125 may be formed on the at least one base pad 15 and the at least one connection pad 120. The at least one connection wiring 125 may include a plurality of wires. Since the first to fourth adhesive members 20, 90, 100, and 110 and the first to fourth semiconductor chips 25, 95, 105, and 115 may be parallel to the substrate 10, the connection wiring 125 may be stably connected with the at least one base pad 15 and the at least one connection pad 120.

A filling structure 130 may be formed on the substrate 10 and the first to fourth semiconductor chips 25, 95, 105, and 115 to cover the at least one connection pad 120 and the at least one connection wiring 125. The filling structure 130 may include resin and fillers. A diameter of each of the fillers may be larger than the thickness T2 of the first adhesive member 20 and the first semiconductor chip 25. In example embodiments, the filling structure 130 may sufficiently fill the space S defined at the remaining side of the first to fourth semiconductor chips 25, 95, 105, and 115 through the filling auxiliary structure 30 without any void.

Accordingly, the filling auxiliary structure 30 may constitute a semiconductor package 128 according to example embodiments together with the first to fourth adhesive members 20, 90, 100, and 110, the semiconductor chips 25, 95, 105, and 115, and the at least one connection wiring 125. The semiconductor package 128 may constitute a semiconductor package structure 140 according to example embodiments together with the substrate 10 and the filling structure 130.

Figure 6:
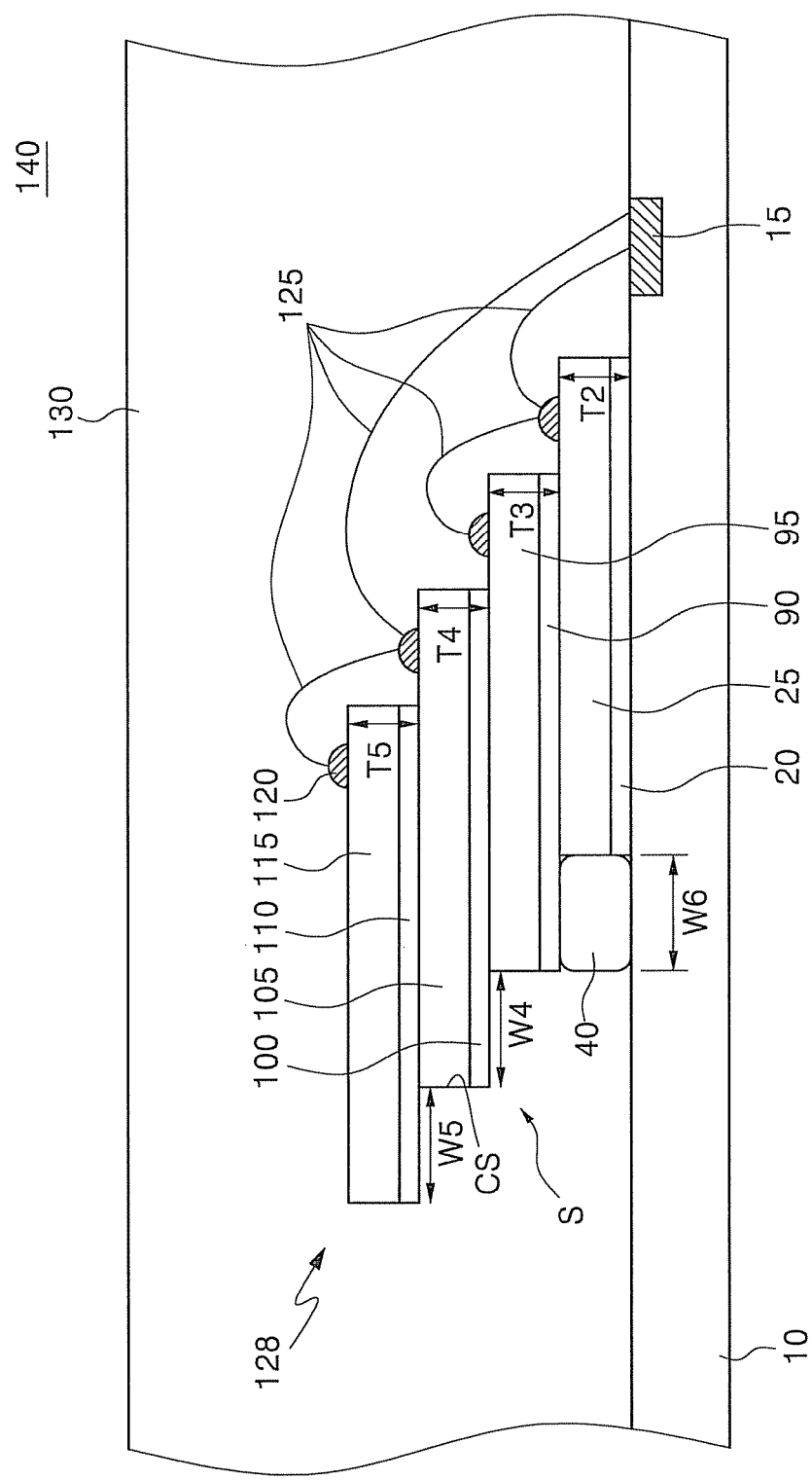
FIG. 6 is a cross-sectional view taken along line I-I of FIG. 1 illustrating a method of forming a semiconductor package structure according to example embodiments.

FIG. 6 is a cross-sectional view taken along line I-I' of FIG. 1 illustrating a method of forming a semiconductor package structure according to example embodiments. FIG. 6 uses like reference numerals for like members as shown in FIGS. 3 to 5.

Referring to FIG. 6, a substrate 10 may be prepared according to example embodiments. The substrate 10 may include at least one base pad 15. A first adhesive member 20 and a first semiconductor chip 25 may be sequentially formed on the substrate 10. The first adhesive member 20 and the first semiconductor chip 25 may be formed to expose the at least one base pad 15 at a selected side thereof. The first adhesive member 20 and the first semiconductor chip 25 may have a thickness T2 that may or may not be predetermined.

A filling auxiliary structure 40 may be formed on the remaining side of the first adhesive member 20 and the first semiconductor chip 25. The filling auxiliary structure 40 may have a width W1 that may or may not be predetermined. The filling auxiliary structure 40 may include resin and/or fillers. In the case in which the filling auxiliary structure 40 includes the fillers, a diameter of each of the fillers of the filling auxiliary structure 40 may be smaller or larger than the thickness T2 of the first adhesive member 20 and the first semiconductor chip 25. The filling auxiliary structure 40 may include a material which is easily transformed and or deformed by external pressure in addition to resin and/or fillers.

The processes of FIGS. 4 and 5 may be applied to the first adhesive member 20, the first semiconductor chip 25, and the filling auxiliary structure 40. In example embodiments, the filling structure 130 may be formed on the substrate 10 and the first to fourth semiconductor chips 25, 95, 105, and 115 of FIG. 5 to cover the at least one connection pad 120 and the at least one connection wiring 125 of FIG. 5, as illustrated in FIG. 6. The filling structure 130 may include resin and fillers. A diameter of each of the fillers of the filling structure 130 may be larger than the thickness T2 of the first adhesive member 20 and the first semiconductor chip 25.

The diameter of each of the fillers of the filling structure 130 may be larger than the diameter of the fillers of the filling auxiliary structure 40. The filling structure 130 may sufficiently fill a space S defined at the remaining side of the first to fourth semiconductor chips 25, 95, 105, and 115 of FIG. 5 without any void. The first to fourth adhesive members 20, 90, 100, and 110 of FIG. 5, and the first to fourth semiconductor chips 25, 95, 105, and 115 may be parallel to the substrate 10 due to the filling auxiliary structure 40 without being inclined toward the substrate 10.

Accordingly, the filling auxiliary structure 40 may constitute a semiconductor package 128 according to example embodiments together with the first to fourth adhesive members 20, 90, 100, and 110, the semiconductor chips 25, 95, 105, and 115, and the at least one connection wiring 125 as illustrated in FIG. 6. The semiconductor package 128 may constitute a semiconductor package structure 140 according to example embodiments together with the substrate 10 and the filling structure 130.

Figure 7:
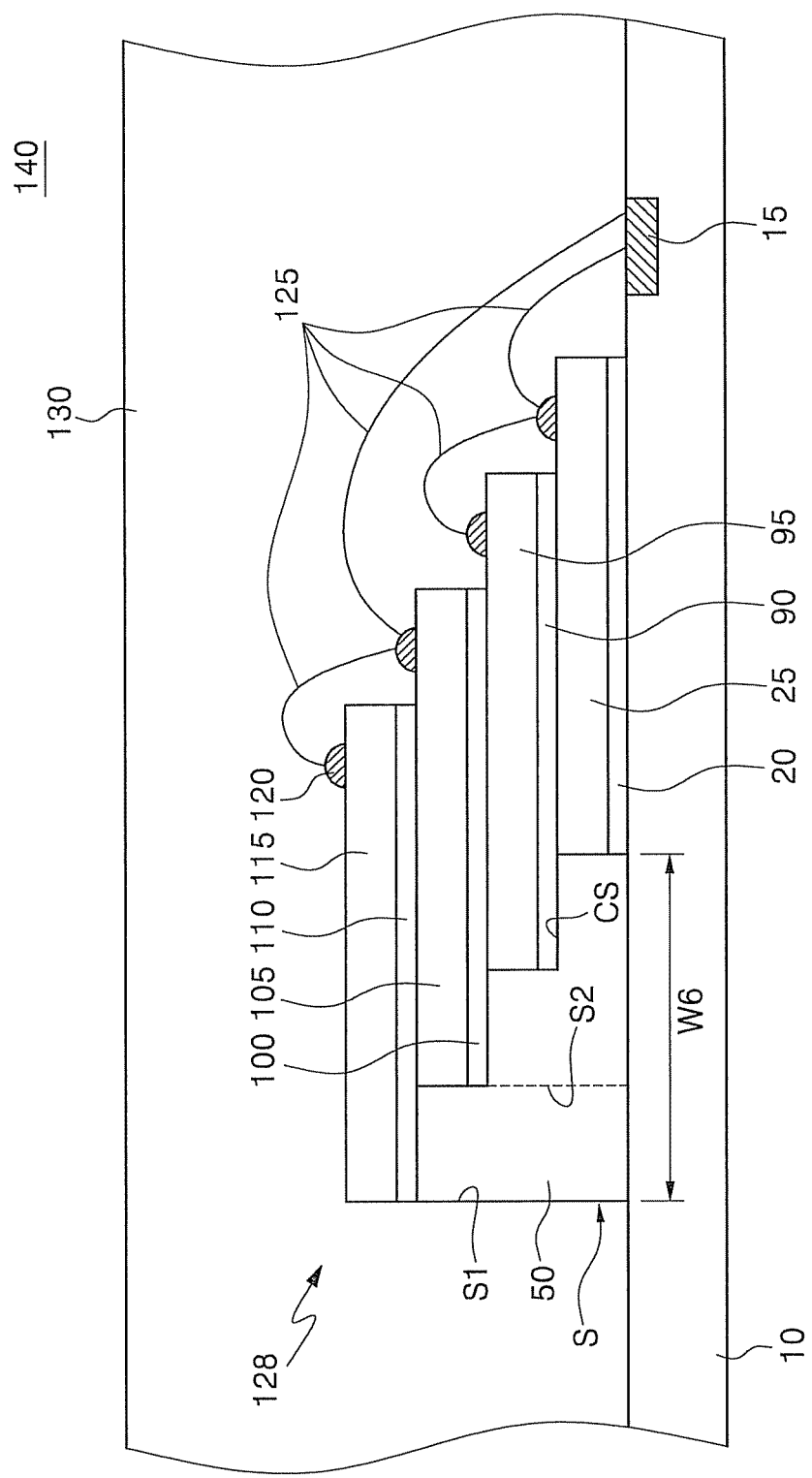
FIG. 7 is a cross-sectional view taken along line I-I' of FIG. 1 illustrating a method of forming a semiconductor package structure according to example embodiments.

FIG. 7 is a cross-sectional view taken along line I-I' of FIG. 1 illustrating a method of forming a semiconductor package structure according to example embodiments. FIG. 7 uses like reference numerals for like members as shown in FIGS. 3 to 5.

Referring to FIG. 7, a substrate 10 may be prepared according to example embodiments. The processes of FIGS. 3 to 5 may be applied to the substrate 10 without forming the filling auxiliary structure 30 or 40 of FIG. 3 or 6. In this case, the first to fourth adhesive members 20, 90, 100, and 110 and the semiconductor chips 25, 95, 105, and 115 of FIG. 5 may expose at least one base pad 15 at the selected side thereof as illustrated in FIG. 7. A filling auxiliary structure 50 may be formed at the remaining side of the first to fourth adhesive members 20, 90, 100, and 110 and the semiconductor chips 25, 95, 105, and 115.

The filling auxiliary structure 50 may be formed during or after formation of the first to fourth adhesive members 20, 90, 100, and 110 and the first to fourth semiconductor chips 25, 95, 105, and 115. The filling auxiliary structure 50 may be fowled along a cascade shape CS at the remaining side of the first to fourth adhesive members 20, 90, 100, and 110 and the first to fourth semiconductor chips 25, 95, 105, and 115 as illustrated in FIG. 7. The filling auxiliary structure 50 may sufficiently fill a space S defined at the remaining side of the first to fourth adhesive members 20, 90, 100, and 110 and the first to fourth semiconductor chips 25, 95, 105, and 115.

The filling, auxiliary structure 50 may include the same material as the filling auxiliary structure 30 or 40 of FIG. 3 or 6. The filling auxiliary structure 50 may have the substantially same surface S1 as side surfaces of the fourth adhesive member 110 and the fourth semiconductor chip 115 or may be aligned with the side surfaces of the fourth adhesive member 110 and the fourth semiconductor chip 115. The filling auxiliary structure 50 may be formed during or after formation of the first to third adhesive members 20, 90, and 100 and the first to third semiconductor chips 25, 95, and 105 of FIG. 5. The filling auxiliary structure 50 may be formed along the cascade shape CS at an remaining side of the first to third adhesive members 20, 90, and 100 and the first to third semiconductor chips 25, 95, and 105 of FIG. 5, as illustrated in FIG. 7. The filling auxiliary member 50 may have a width of W6 which may be equal to a horizontal distance from a side of the first semiconductor chip 25 and the first adhesive member 20 to an outer edge of the fourth adhesive member 110 and an outer edge of the fourth semiconductor chip 115.

The filling auxiliary structure 50 may partially or completely fill the space S defined at the remaining side of the first to fourth adhesive members 20, 90, 100, and 110 and the first to fourth semiconductor chips 25, 95, 105, and 115. The filling auxiliary structure 50 may have the substantially same surface S2 as side surfaces of the third adhesive member 100 and the third semiconductor chip 105 or be aligned with the side surfaces of the third adhesive member 100 and the third semiconductor chip 105. A filling structure 130 may be formed on the substrate 10 and the first to fourth semiconductor chips 25, 95, 105, and 115 to cover the at least one connection pad 120 and the at least one connection wiring 125 of FIG. 5, as illustrated in FIG. 7. The filling structure 130 may include resin and fillers.

A diameter of each of the fillers of the filling structure 130 may be larger than the thickness T2 of the first adhesive member 20 and the first semiconductor chip 25 of FIG. 5. The filling structure 130 may sufficiently fill a periphery or a portion of the space S defined at the remaining side of the first to fourth semiconductor chips 25, 95, 105, and 115 of FIG. 5 through the filling auxiliary structure 50 without any void. The first to fourth adhesive members 20, 90, 100, and 110 and the first to fourth semiconductor chips 25, 95, 105, and 115 may be parallel to the substrate 10 due to the filling auxiliary structure 50 without being inclined toward the substrate 10.

Accordingly, the filling auxiliary structure 50 may constitute a semiconductor package 128 according to example embodiments together with the first to fourth adhesive members 20, 90, 100, and 110, the semiconductor chips 25, 95, 105, and 115, and the at least one connection wiring 125 as illustrated in FIG. 7. The semiconductor package 128 may constitute a semiconductor package structure 140 according to example embodiments together with the substrate 10 and the filling structure 130.

Although the filling auxiliary structure 50 has been described as being fabricated during or after a formation of the first to fourth adhesive members 20, 90, 100, and 110 and the first to fourth semiconductor chips 25, 95, 105, and 115, example embodiments are not limited thereto. For example, the filling auxiliary structure 50 may be prepared in advance as a relatively solid structure which may be provided to the substrate 10 or formed on the substrate 10 before the formation of the first to fourth adhesive members 20, 90, 100, and 110 and the first to fourth semiconductor chips 25, 95, 105, and 115. Therefore, because the filling auxiliary structure 50 may be provided to the substrate 10 or formed on the substrate 10 before the semiconductor chips 25, 95, 105, and 115 are provided to the substrate, the filling auxiliary structure 50 may aid in aligning the semiconductor chips 25, 95, 105, and 115 during fabrication.

Figure 8:
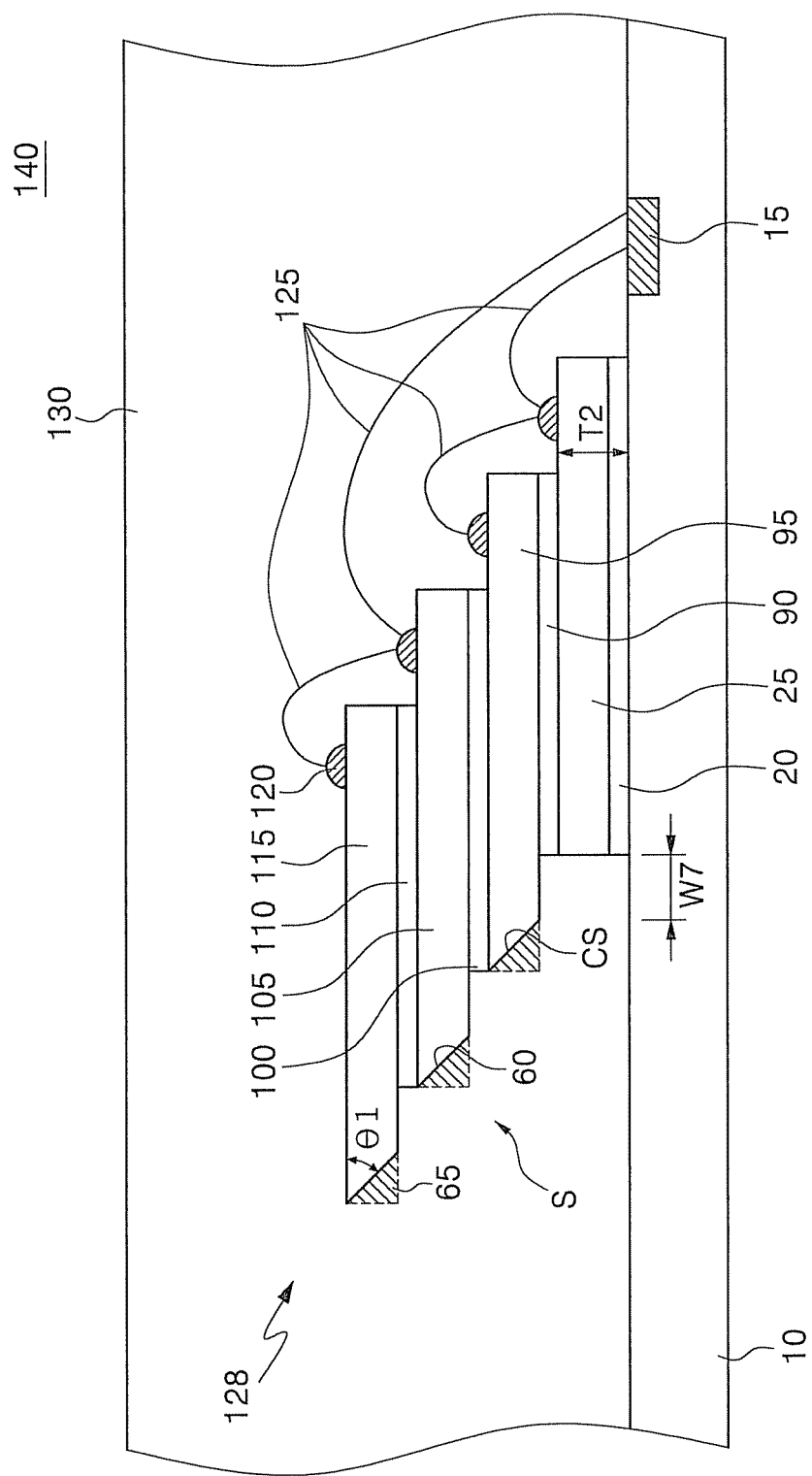
FIG. 8 is a cross-sectional view taken along line I-I' of FIG. 1 illustrating a method of forming a semiconductor package structure according to example embodiments.

FIG. 8 is a cross-sectional view taken along line I-I of FIG. 1 illustrating a method of forming a semiconductor package structure according to example embodiments. FIG. 8 uses like reference numerals for like members as shown in FIGS. 3 to 5.

Referring to FIG. 8, a substrate 10 may be prepared according to example embodiments. The processes of FIGS. 3 to 5 may be applied to the substrate 10 without forming the filling auxiliary structure 30, 40, or 50 of FIG. 3, 6, or 7. In this case, the first to fourth adhesive members 20, 90, 100, and 110 and the first to fourth semiconductor chips 25, 95, 105, and 115 of FIG. 5 may expose at least one base pad 15 at the selected side thereof as illustrated in FIG. 8. The second to fourth semiconductor chips 95, 105, and 115 of FIG. 5 may have inclined corners at the remaining side thereof as illustrated in FIG. 8.

The inclined corners may be formed by removing sacrificial portions 65 of FIG. 8 from corners of the second to fourth semiconductor chips 95, 105, and 115 at an angle θ1 that may or may not be predetermined. In FIG. 8, the sacrificial portions 65 are denoted by dotted lines. A surface of each of the inclined corners of the second to fourth semiconductor chips 95, 105, and 115 may or may not contact a side surface of each of the first to third semiconductor chips 25, 95, and 105. In the case in which the surface of each of the inclined corners do not contact the side surface of each of the first to third semiconductor chips 25, 95, and 105, the second to fourth semiconductor chips 95, 105, and 115 may protrude from the side surface of each of the first to third semiconductor chips 25, 95, and 105 by a width W7 that may or may not be predetermined. However, example embodiments are not limited thereto. For example, the second to fourth semiconductor chips 95, 105, and 115 may protrude from the side surfaces of each of the first to third semiconductor chips 25, 95, and 105 at different or various widths.

Surfaces of the inclined corners may be included in a cascade shape CS along a bold line at the remaining side of the first to fourth adhesive members 20, 90, 100, and 110, and the first to fourth semiconductor chips 25, 95, 105, and 115 of FIG. 7. The cascade shape CS at the remaining side of the first to fourth adhesive members 20, 90, 100, and 110, and the first to fourth semiconductor chips 25, 95, 105, and 115 may be different from a cascade shape CS at the selected side thereof. The cascade shape at the remaining side of the first to fourth adhesive members 20, 90, 100, and 110, and the first to fourth semiconductor chips 25, 95, 105, and 115 may form a filling auxiliary structure 60.

Alternatively, only the second semiconductor chip 95 among the second to fourth semiconductor chips 95, 105, and 115 may have an inclined corner. The filling structure 130 may be formed on the substrate 10 and the first to fourth semiconductor chips 25, 95, 105, and 115 of FIG. 5 to cover the at least one connection pad 120 and the at least one connection wiring 125 of FIG. 5 as illustrated in FIG. 8. The filling structure 130 may include resin and fillers. A diameter of each of the fillers of the filling structure 130 may be larger than the thickness T2 of the first adhesive member 20 and the first semiconductor chip 25 of FIG. 5.

The filling structure 130 may sufficiently fill a space S defined at the remaining side of the first to fourth semiconductor chips 25, 95, 105, and 115 through the filling auxiliary structure 60 without any void. This is because the probability that the fillers of the filling structure 130 will block a portion of the space S between the first and second adhesive members 20 and 90 and the semiconductor chips 25 and 95 is very low due to the inclined corner of the second semiconductor chip 95. The filling structure 130 may be further affected by gravity due to the filling auxiliary structure 60 as compared with not having the inclined corner, and thus the pressure due to the gravity can be applied to the fillers to sufficiently fill the space S.

The first to fourth adhesive members 20, 90, 100, and 110 and the first to fourth semiconductor chips 25, 95, 105, and 115 may be parallel to the substrate 10 without being inclined toward the substrate 10 due to the filling auxiliary structure 60. Accordingly, the filling auxiliary structure 60 may constitute a semiconductor package 128 according to example embodiments together with the first to fourth adhesive members 20, 90, 100, and 110, the semiconductor chips 25, 95, 105, and 115, and the at least one connection wiring 125 as illustrated in FIG. 8. The semiconductor package 128 may constitute a semiconductor package structure 140 according to example embodiments together with the substrate 10 and the filling structure 130.

Figure 9:
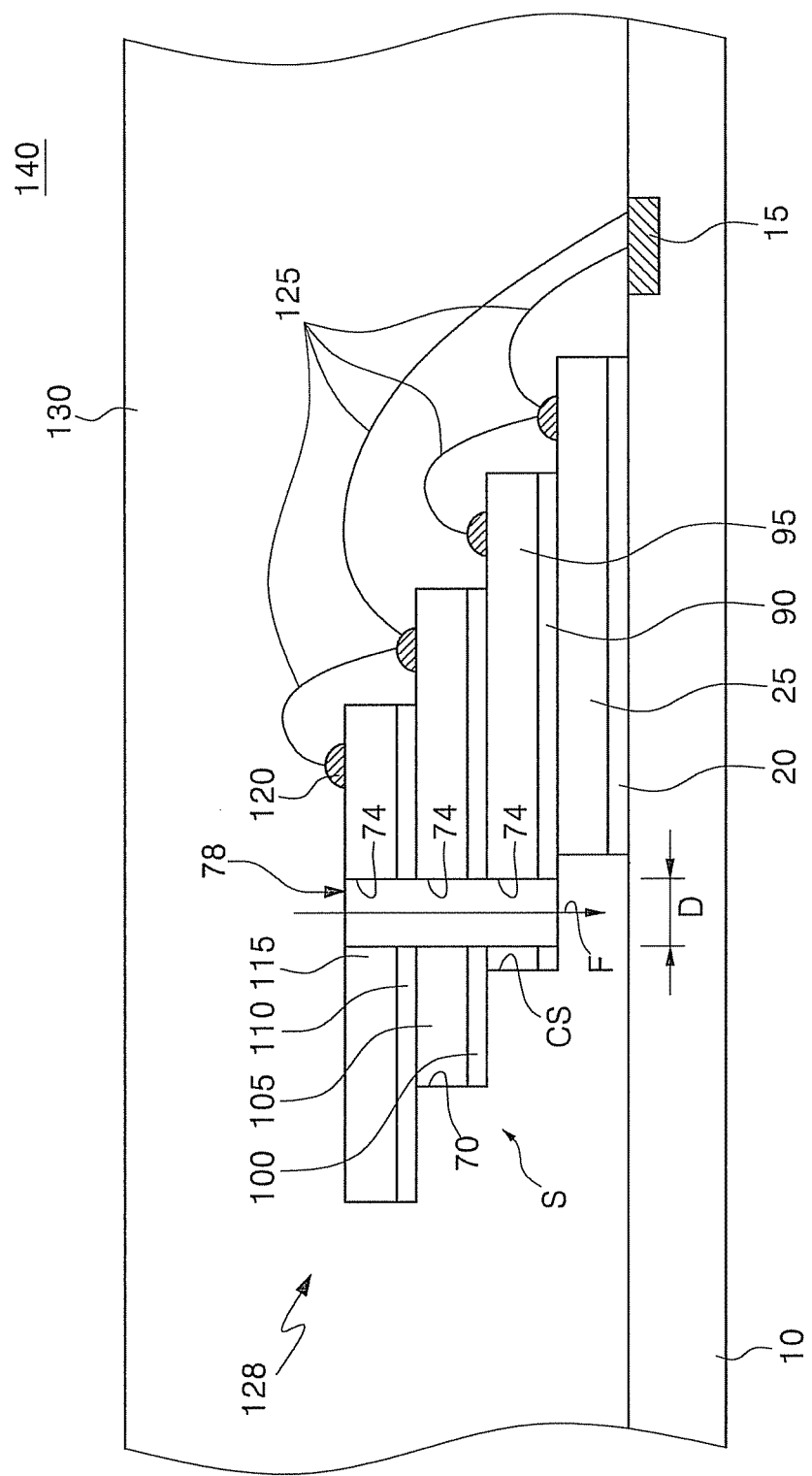
FIG. 9 is a cross-sectional, view taken along line I-I' of FIG. 1 illustrating a method of forming a semiconductor package structure according to example embodiments.

FIG. 9 is a cross-sectional view taken along line I-I of FIG. 1 illustrating a method of forming a semiconductor package structure according to example embodiments. FIG. 9 uses like reference numerals for like members as shown in FIGS. 3 to 5.

Referring to FIG. 9, a substrate 10 may be prepared according to example embodiments. The processes of FIGS. 3 to 5 may be applied to the substrate 10 without forming the filling auxiliary structure 30, 40, or 50 of FIG. 3, 6, or 7. In this case, the first to fourth adhesive members 20, 90, 100, and 110 and the first to fourth semiconductor chips 25, 95, 105, and 115 of FIG. 5 may expose at least one base pad 15 at the selected side thereof as illustrated in FIG. 9. Preliminary through holes 74 may be formed in the second to fourth semiconductor chips 95, 105, and 115 of FIG. 5, respectively, as illustrated in FIG. 9.

The preliminary through holes 74 may be formed at the remaining side of the second to fourth semiconductor chips 95, 105, and 115. The second to fourth adhesive members 90, 100, and 110 of FIG. 5 may be formed below the second to fourth semiconductor chips 95, 105, and 115, respectively. The second to fourth adhesive members 90, 100, and 110 may be formed around the preliminary through holes 74 of the second to fourth semiconductor chips 95, 105, and 115 as illustrated in FIG. 9. The second to fourth adhesive members 90, 100, and 110 and the second to fourth semiconductor chips 95, 105, and 115 may be sequentially formed on the first adhesive member 20 and the first semiconductor chip 25 while aligning the preliminary through holes 74.

The second to fourth adhesive members 90, 100, and 110 and the second to fourth semiconductor chips 95, 105, and 115 may form a through hole 78 which passes through the preliminary through holes 74 as illustrated in FIG. 9. A diameter D of the through hole 78 may be larger than the thickness T2 of the first adhesive member 20 and the first semiconductor chip 25 of FIG. 5. An opening cross-sectional surface of the through hole 78 may be included in a cascade shape CS along a bold line at a remaining side of the first to fourth adhesive members 20, 90, 100, and 110 and the first to fourth semiconductor chips 25, 95, 105, and 115 as illustrated in FIG. 9.

The cascade shape CS at the remaining side of the first to fourth adhesive members 20, 90, 100, and 110 and the first to fourth semiconductor chips 25, 95, 105, and 115 may be different from a cascade shape CS at the selected side thereof. The cascade shape CS at the remaining side of the first to fourth adhesive members 20, 90, 100, and 110 and the first to fourth semiconductor chips 25, 95, 105, and 115 may form a filling auxiliary structure 70.

Alternatively, the preliminary through hole 74 may be simultaneously formed in the second adhesive member 90 and the second semiconductor chip 95. The preliminary through hole 74 may be simultaneously formed in the third adhesive member 100 and the third semiconductor chip 105. The preliminary through hole 74 may be simultaneously formed in the fourth adhesive member 110 and the fourth semiconductor chip 115. A filling structure 130 may be formed on the substrate 10 and the first to fourth semiconductor chips 25, 95, 105, and 115 to cover the at least one connection pad 120 and the at least one connection wiring 125 of FIG. 5 as illustrated in FIG. 9. The filling structure 130 may include resin and fillers.

A diameter of each of the fillers of the filling structure 130 may be larger than the thickness T2 of the first adhesive member 20 and the first semiconductor chip 25 of FIG. 5. The filling structure 130 may sufficiently fill a space S defined at the remaining side of the first to fourth semiconductor chips 25, 95, 105, and 115 through the filling auxiliary structure 70 without any void. This is because the filling structure 130 may fill a space below the cascade shape CS through the space S and the through hole 78 when the fillers of the filling structure 130 block a space between the first and second adhesive members 20 and 90 and the first and second semiconductor chips 25 and 95.

The filling structure 130 may fill a space between the first and second adhesive members 20 and 90 and the first and second semiconductor chips 25 and 95 along an arrow F of the through hole 78. The first to fourth adhesive members 20, 90, 100, and 110 and the first to fourth semiconductor chips 25, 95, 105, and 115 may be parallel to the substrate 10 due to the filling auxiliary structure 70 without being inclined toward the substrate 10. Accordingly, the filling auxiliary structure 70 may constitute a semiconductor package 128 according to example embodiments together with the first to fourth adhesive members 20, 90, 100, and 110, the semiconductor chips 25, 95, 105, and 115, and the at least one connection wiring 125 as illustrated in FIG. 9. The semiconductor package 128 may constitute a semiconductor package structure 140 according to example embodiments together with the substrate 10 and the filling structure 130.

FIG. 10 is a cross-sectional view taken along line I-I' of FIG. 1 illustrating a method of forming a semiconductor package structure according to example embodiments. FIG. 10 uses like reference numerals for like members as shown in FIGS. 3 to 5.

Referring to FIG. 10, a substrate 10 may be prepared according to example embodiments. The substrate 10 may include at least one base pad 15. A filling auxiliary structure 80 may be aimed on the substrate 10. The filling auxiliary structure 80 may expose the at least one base pad 15 at a selected side thereof. A top surface of the filling auxiliary structure 80 may be inclined at an angle θ2 with respect to a top surface of the substrate 10. In example embodiments, the angle θ2 may or may not be predetermined. The filling auxiliary structure 80 may have a shape which is tapered toward the selected side from the remaining side thereof.

A first adhesive member 20 and a first semiconductor chip 25 may be formed on the filling auxiliary structure 80. The processes of FIGS. 3 to 5 may be applied to the substrate 10 having the first semiconductor chip 25 without forming the filling auxiliary structure 30, 40, or 50 of FIG. 3, 6, or 7. In this case, the first to fourth adhesive members 20, 90, 100, and 110 and the first to fourth semiconductor chips 25, 95, 105, and 115 of FIG. 5 may be fixed to the filling auxiliary structure 80 so as not to slip from the filling auxiliary structure 80. A height H between a top surface of the substrate 10 and a top surface of the first semiconductor chip 25 may be larger than that of FIG. 5 due to the shape in which the filling auxiliary structure 80 is tapered at both sides of the first to fourth adhesive members 20, 90, 100, and 110 and the first to fourth semiconductor chips 25, 95, 105, and 115.

Alternatively, the filling auxiliary structure 80 may have a shape different from the tapered shape. For example, the filling auxiliary structure 80 may have the substantially same thickness from the top surface of the substrate 10. At least one connection wiring 125 may be formed on the at least one base pad 15 and the at least one connection pad 120 of FIG. 5 as illustrated in FIG. 10. Since the first to fourth adhesive members 20, 90, 100, and 110 and the first to fourth semiconductor chips 25, 95, 105, and 115 may be stably fixed to the filling auxiliary structure 80, the at least one connection wiring 125 may be stably connected with the at least one base pad 15 and the at least one connection pad 120.

A filling structure 130 may be formed on the substrate 10 and the first to fourth semiconductor chips 25, 95, 105, and 115 to cover the at least one connection pad 120 and the at least one connection wiring 125 of FIG. 5 as illustrated in FIG. 10. The filling structure 130 may include resin and fillers. A diameter of each of the fillers of the filling structure 130 may be larger than the thickness T2 of the first adhesive member 20 and the first semiconductor chip 25 of FIG. 5. However, the filling structure 130 may sufficiently fill a space S defined at the remaining side of the first to fourth semiconductor chips 25, 95, 105, and 115 through the filling auxiliary structure 80 without any void.

This is because the diameter of each of the fillers of the filling structure 130 is smaller than the height H between the top surface of the substrate 10 and the top surface of the first semiconductor chip 25. The fillers of the filling structure 130 do not block a space between the first and second adhesive members 20 and 90 and the first and second semiconductor chips 25 and 95. Therefore, the filling structure 130 may sufficiently fill a space below the cascade shape CS through the space S. Accordingly, the filling auxiliary structure 80 may constitute a semiconductor package 128 according to example embodiments together with the first to fourth adhesive members 20, 90, 100, and 110, the semiconductor chips 25, 95, 105, and 115, and the at least one connection wiring 125 as illustrated in FIG. 10. The semiconductor package 128 may constitute a semiconductor package structure 140 according to example embodiments together with the substrate 10 and the filling structure 130.

Example embodiments illustrated in FIGS. 1-10 illustrate examples of semiconductor packages 128 cascaded in one direction. However, example embodiments are not limited thereto. For example, FIG. 2 illustrates a second semiconductor chip 95 mounted on a first semiconductor chip 25, a third semiconductor chip 105 mounted on the second semiconductor chip 95, and a fourth semiconductor chip 115 mounted on the third semiconductor chip 110. In FIG. 2, the semiconductor chips 95, 105, and 115 extend in a "leftward" direction. However, example embodiments, are not limited thereto. For example, the second, third, and fourth semiconductor chip 95, 105, and 115 may, instead of extending "leftward," extend either into or out of the page, or in a "rightward" direction. For example, in example embodiments, the second semiconductor chip 95 may extend in the "leftward direction" and the third and fourth semiconductor chips 105 and 115 may extend into or out of the page. As another example, the second semiconductor chip 95 may extend in the "leftward direction," the third semiconductor chip 105 may extend out of the page, and the fourth semiconductor chip 115 may extend in a "rightward" direction.

Example embodiments illustrated in FIGS. 1-10 provide examples of semiconductor packages 128 cascaded in one direction. In other words, FIGS. 1-10 show example embodiments wherein first through fourth semiconductor chips 25, 95, 105, and 115 are offset from one another. In this example, the chips may be the same size and may simply be offset from one another. The offsets may all be in a "leftward" direction or a "rightward" direction and may all be the same. Example embodiments, however, are not limited thereto. For example, the offsets may be staggered. For example, the second semiconductor chip 95 may be stacked on the first semiconductor chip 25 and may be offset in a "leftward" direction. The third semiconductor chip 105 may be stacked on the second semiconductor chip 95 and may be offset in a "rightward" direction. The fourth semiconductor chip 115 may be stacked on the third semiconductor chip 105 and may be offset in a "leftward" direction.

Example embodiments are not limited to the cascaded arrangements illustrated in FIGS. 1-10. In FIG. 2, for example, the semiconductor package structure 140 has chips arranged such that a profile of the semiconductor package structure 140 on a "left side" of the semiconductor package structure 140 is similar to a profile of the semiconductor package structure 140 on the "right side" of the semiconductor package structure 140. However, example embodiments are not limited thereto. For example, the second semiconductor chip 95 may be longer than first semiconductor chip 25, the third semiconductor chip 105 may be longer than the second semiconductor chip 95, and the fourth semiconductor chip 115 may be longer than the third semiconductor chip 105. Furthermore, these chips may be arranged so that the centers of the chips overlap one another so that the "left side" of the semiconductor package structure has a cascaded profile extending in one direction and the "right side" of the semiconductor package has a cascaded profile extending in an opposite direction.

Additionally, example embodiments are not limited to semiconductor package structures having cascaded profiles at both a "left" and a "right" side. For example, the second semiconductor chip 95 may be longer than first semiconductor chip 25, the third semiconductor chip 105 may be longer than the second semiconductor chip 95, and the fourth semiconductor chip 115 may be longer than the third semiconductor chip 105. In this example, these chips may be arranged so that the chips overlap each other with their respective "right" sides being aligned with one another. This structure would result in a semiconductor package structure having cascaded "left side" and no cascaded right side.

Next, a semiconductor package structure having at least two semiconductor packages on a substrate and a method of aiming the same according to example embodiments will be described with reference to FIGS. 11 to 18.

A semiconductor package structure according to example embodiments will be described in more detail with reference to FIGS. 11 and 12.

Figure 11:
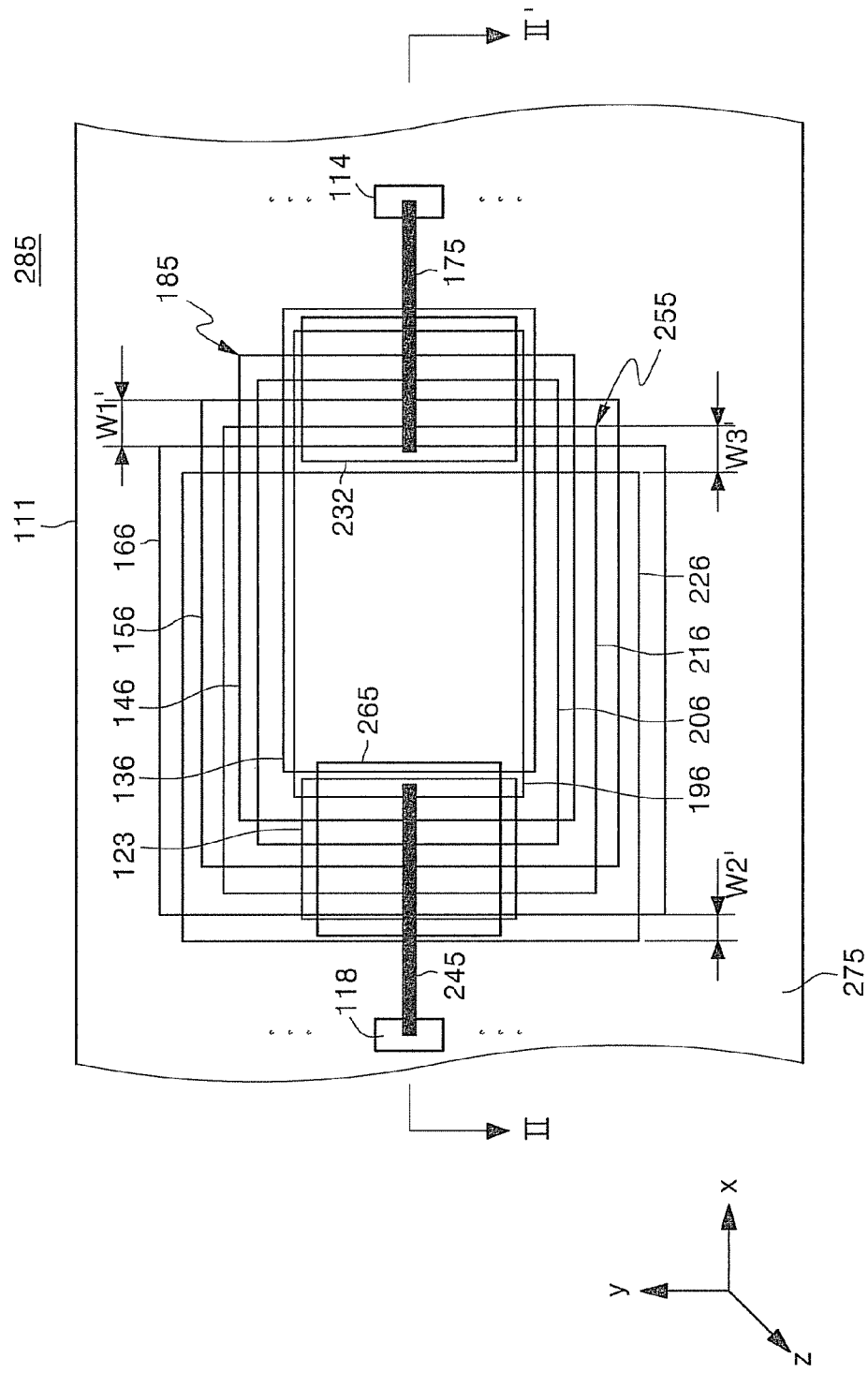
FIG. 11 is a plan view of a semiconductor package structure according to example embodiments.

FIG. 11 is a plan view of a semiconductor package structure according to example embodiments.

Referring to FIG. 11, a semiconductor package structure 285 may include first and second semiconductor packages 185 and 255. The first semiconductor package 185 may include first semiconductor chips 136, 146, 156, and 166. The first semiconductor chips 136, 146, 156 and 166 may have the substantially same area as or different areas from each other in X and Y directions.

The first semiconductor chips 136, 146, 156, 166 may partially or fully overlap each other in the X direction and/or the Y direction. The first semiconductor chips 136, 146, 156, 166 may partially expose each other through either side in the X direction and/or the Y direction. For example, the first semiconductor chips 136, 146, 156 and 166 may protrude from each other by a width W1' in the X direction. In example embodiments, the width W1' may or may not be predetermined.

The first semiconductor chips 136, 146, 156, 166 may include a non-volatile memory device and/or a volatile memory device. The second semiconductor package 255 may include second semiconductor chips 196, 206, 216, and 226. The second semiconductor chips 196, 206, 216 and 226 may overlap the first semiconductor chips 136, 146, 156 and 166.

In this case, the second semiconductor chips 196, 206, 216 and 226 may protrude from the first semiconductor chips 136, 146, 156 and 166 by a width W2' in the X direction. In example embodiments, the width W2' may or may not be predetermined. The second semiconductor chips 196, 206, 216, and 226 may have the substantially same area as or different areas from the first semiconductor chips 136, 146, 156, and 166.

The second semiconductor chips 196, 206, 216, and 226 may have substantially the same area as or different areas from each other. For example, the second semiconductor chips 196, 206, 216, and 226 may have different lengths in the X direction and/or the Y direction. The second semiconductor chips 196, 206, 216, 226 may partially overlap each other in the X direction and/or the Y direction. The second semiconductor chips 196, 206, 216, 226 may partially expose each other through either side in the X direction and/or the Y direction.

For example, the second semiconductor chips 196, 206, 216 and 226 may protrude from each other by a width W3' in the X direction. In example embodiments, the width W3' may or may not be predetermined. The second semiconductor chips 196, 206, 216 and 226 may include a non-volatile memory device and/or a volatile memory device. The first and second semiconductor packages 185 and 255 may further include first and second filling auxiliary structures 123 and 232 that may be sequentially disposed in the X direction.

The first filling auxiliary structure 123 may extend from one side of the first semiconductor chips 136, 146, 156, and 166 toward the X and Y directions by corresponding to the first semiconductor chips 136, 146, 156, and 166. The first filling auxiliary structure 123 may sufficiently or partially extend with respect to the one side of the first semiconductor chips 136, 146, 156 and 166.

The second filling auxiliary structure 232 may extend from the other side of the first semiconductor chips 136, 146, 156, and 166 toward the X and Y directions by corresponding to the first semiconductor chips 136, 146, 156, and 166 and the second semiconductor chips 196, 206, 216, and 226. The second filling auxiliary structure 232 may sufficiently or partially extend with respect to the other side of the first semiconductor chips 136, 146, 156 and 166.

The first and second filling auxiliary structures 123 and 232 may be disposed in the Y direction in turn. In this case, the first and second filling auxiliary structures 123 and 232 may sufficiently or partially extend with respect to the remaining sides of the first semiconductor chips 136, 146, 156 and 166 and/or the second semiconductor chips 196, 206, 216, and 226.

The first and second semiconductor packages 185 and 255 may further include at least one first connection wiring 175 and at least one second connection wiring 245, respectively. The semiconductor package structure 285 may further include a substrate 111 and a filling structure 275. The substrate 111 may extend from the first and second semiconductor packages 185 and 255 toward the X and Y directions. The substrate 111 may include a PCB.

The substrate 111 may include an electric circuit (not shown) and base pads 114 and 118. The base pads 114 and 118 may be electrically connected with the electric circuit. The filling structure 275 may be disposed on the substrate 111. The at least one first connection wiring 175 may be disposed at the other side of the first semiconductor chips 136, 146, 156, and 166. The at least one first connection wiring 175 may connect the base pad 114 with the first semiconductor chips 136, 146, 156, and 166.

The at least one second connection wiring 245 may be disposed at the one side of the first semiconductor chips 136, 146, 156, and 166. The at least one second connection wiring 245 may connect the base pad 118 with the second semiconductor chips 196, 206, 216, and 226. The filling structure 275 may cover the first and second semiconductor packages 185 and 255, the at least one first connection wiring 175 and the at least one second connection wiring 245.

Figure 12:
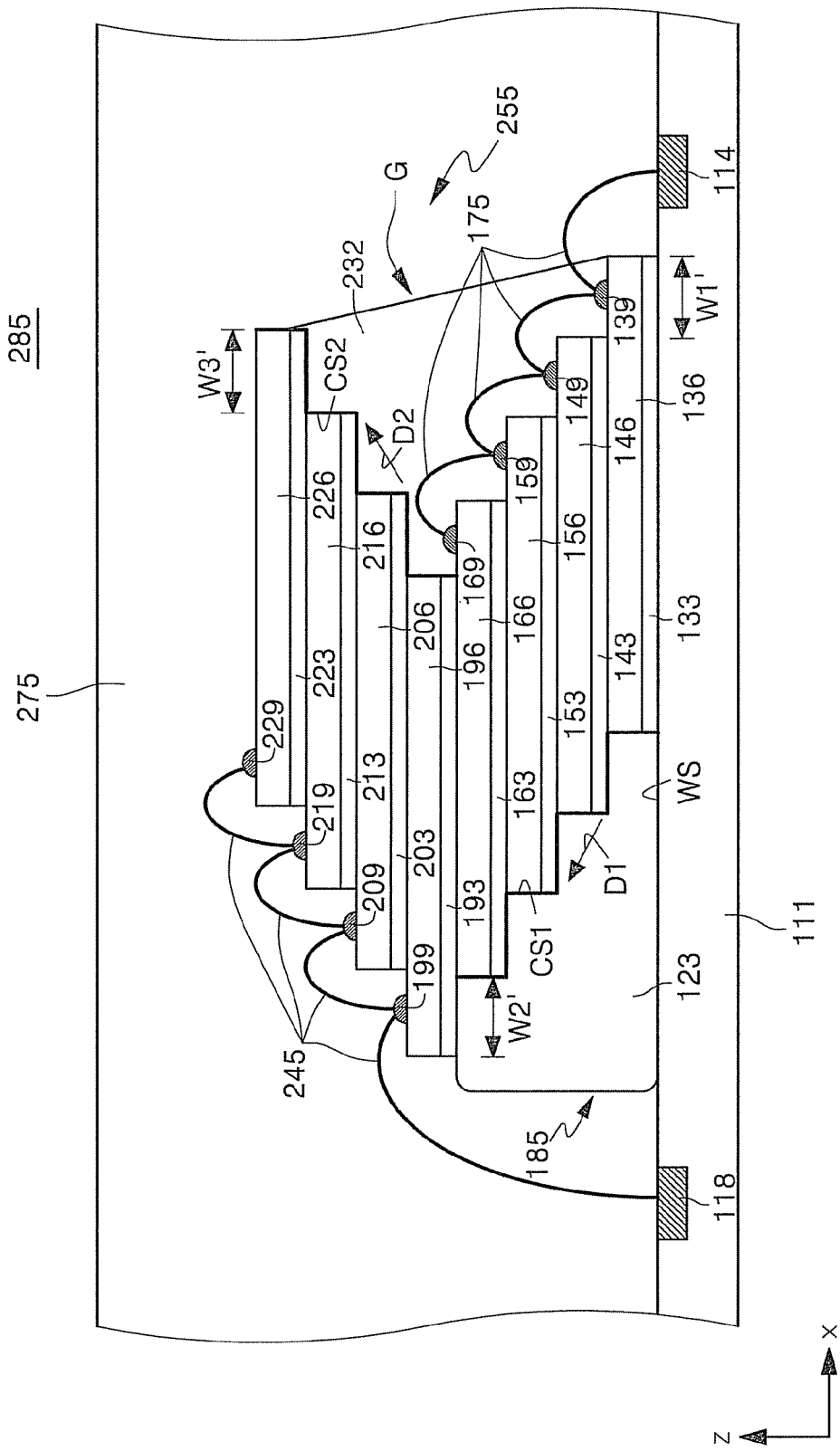
FIG. 12 is a cross-sectional view of a semiconductor package structure taken along line II-II' of FIG. 11.

FIG. 12 is a cross-sectional view taken along line II-II of FIG. 11 illustrating a semiconductor package structure according to example embodiments.

Referring to FIG. 12, a semiconductor package structure 285 may include a substrate 111 and first and second semiconductor packages 185 and 255. The substrate 111 may include an electric circuit (not shown) and base pads 114 and 118. The electric circuit may be connected with the base pads 114 and 118 of the substrate 111. The substrate may include a PCB.

The substrate 111 may be flexible or non-flexible. The first semiconductor package 185 may be disposed on the substrate 111. The first semiconductor package 185 may include first semiconductor chips 136, 146, 156, and 166. The first semiconductor chips 136, 146, 156, and 166 may be sequentially stacked on a working surface (WS) of the substrate 111 in the Z direction.

The first semiconductor chips 136, 146, 156, and 166 may protrude from each other by a width W1' through both sides thereof in a first direction D1 with respect to the working surface of the substrate 111. In example embodiments, the width W1' may or may not be predetermined. In this case, the first semiconductor chips 136, 146, 156, and 166 may be exposed from each other in the first direction D1 at the both sides thereof. The first semiconductor chips 136, 146, 156, and 166 may have first cascade shapes CS1 in the first direction D1 at the both sides thereof.

The first semiconductor chips 136, 146, 156, and 166 may include connection pads 139, 149, 159, and 169, respectively. The first semiconductor package 185 may further include a first auxiliary structure 123 and first adhesive members 133, 143, 153, and 163. The first filling auxiliary structure 123 may be in contact with the first semiconductor chips 136, 146, 156, and 166 through one side of the first semiconductor chips 136, 146, 156, and 166.

The first filling auxiliary structure 123 may be formed as one body below a selected first cascade shape CS1 of the first semiconductor chips 136, 146, 156, and 166. The first filling auxiliary structure 123 may be disposed between the substrate 111 and the first semiconductor chips 136, 146, 156, and 166 along the selected first cascade shape CS1. The first filling auxiliary structure 123 may protrude from the first semiconductor package 185 in the X direction.

The first adhesive members 133, 143, 153, and 163 may be disposed between the substrate 111 and the first semiconductor chips 136, 146, 156, and 166. The first adhesive members 133, 143, 153, and 163 may be in contact with the first filling auxiliary structure 123. The first auxiliary structure 123 may be adhered to the substrate 111 to physically support the first adhesive members 133, 143, 153, and 163 and/or the first semiconductor chips 136, 146, 156, and 166.

A second semiconductor package 255 may be disposed on the first semiconductor package 185. The second semiconductor package 255 may protrude from one side (a second side, for example, the right side) of the first semiconductor chips 136, 146, 156, and 166 by a width W2' in the X direction. In example embodiments, the width W2' may or may not be predetermined. The second semiconductor package 255 may be in contact with the first auxiliary structure 123 to be physically supported by the first auxiliary structure 123.

The second semiconductor package 255 may include second semiconductor chips 196, 206, 216, and 226. The second semiconductor chips 196, 206, 216, and 226 may be sequentially stacked on the first semiconductor package 185 in the Z direction. In example embodiments, the left sides of the second semiconductor chips 196, 206, 216, and 226 (as shown in FIG. 12) may be considered as the first sides of the second semiconductor chips 196, 206, 216, and 226, and the right sides of the second semiconductor chips 196, 206, 216, and 226 may be considered as the second sides of the second semiconductor chips 196, 206, 216, and 226. The second semiconductor chips 196, 206, 216, and 226 may protrude from each other by a width W3' through both sides in a second direction D2 with respect to the working surface WS of the substrate 111. In example embodiments, the width W3' may or may not be predetermined.

The protruded width W3' of each of the second semiconductor chips 196, 206, 216, and 226 may have the same size as or a different size from the protruded width W1' of each of the first semiconductor chips 136, 146, 156, and 166. In this case, the second semiconductor chips 196, 206, 216, and 226 may be exposed from each other at both sides thereof in the second direction D2.

The second semiconductor chips 196, 206, 216, and 226 may have second cascade shapes CS2 in the second direction D2 at the both, sides thereof. The second cascade shapes CS2 are formed by the left sides (the first sides) of the second semiconductor chips 196, 206, 216, and 226 and the right sides (the second sides) of the second semiconductor chips 196, 206, 216, and 226. In this case, the first semiconductor chips 136, 146, 156, and 166 and the second semiconductor chips 196, 206, 216, and 226 may form a groove G on the other side of the first semiconductor chips 136, 146, 156, and 166.

The groove G of the first semiconductor chips 136, 146, 156, and 166 and the second semiconductor chips 196, 206, 216, and 226 is defined by first and second cascade shapes CS1 and CS2. The second semiconductor chips 196, 206, 216, and 226 may include connection pads 199, 209, 219, and 229. The second semiconductor package 255 may further include second adhesive members 193, 203, 213, and 223 and a second filling auxiliary structure 232.

The second adhesive members 193, 203, 213, and 223 may be disposed between the first semiconductor package 185 and the second semiconductor chips 196, 206, 216, and 226. The second filling auxiliary structure 232 may be disposed at the other side (the right sides or the second sides) of the first semiconductor chips 136, 146, 156, and 166 to be in contact with the first adhesive members 143, 153, and 163, the first semiconductor chips 136, 146, 156, and 166, the second adhesive members 193, 203, 213, and 223, and the second semiconductor chips 196, 206, 216, and 226. Although FIG. 11 illustrates an example where the second filling auxiliary structure 232 is formed on top of the first semiconductor chip 136, example embodiments are not limited thereto. For example, the second filling auxiliary structure 232 may be formed on top of the substrate 111 such that the second filling auxiliary structure 232 is in contact with the first adhesive members 133, 143, 153, and 163, the first semiconductor chips 136, 146, 156, and 166, the second adhesive members 193, 203, 213, and 223, and the second semiconductor chips 196, 206, 216, and 226.

The second filling auxiliary structure 232 may be disposed between the first adhesive members and semiconductor chips 133, 143, 153, 163, 136, 146, 156, and 166 and the second adhesive members and semiconductor chips 193, 203, 213, 223, 196, 206, 216, and 226 along the first and second cascade shapes CS1 and CS2. The second filling auxiliary structure 232 may protrude from the second semiconductor package 255 in the X direction.

The second filling auxiliary structure 232 may be adhered to the first semiconductor package 185 to physically support the second adhesive members 193, 203, 213, and 223 and/or the second semiconductor chips 196, 206, 216, and 226. The second filling auxiliary structure 232 may include at least one supporting member. The first and second semiconductor packages 185 and 255 may further include at least one first connection wiring 175 and at least one second connection wiring 245, respectively.

The at least one first connection wiring 175 may be disposed at the other side of the first semiconductor chips 136, 146, 156, and 166 to be in contact with the connection pads 139, 149, 159, and 169 of the first semiconductor chips 136, 146, 156, and 166. The at least one first connection wiring 175 may electrically connect the first semiconductor chips 136, 146, 156, and 166 with each other.

The at least one first connection wiring 175 may extend from the first semiconductor chips 136, 146, 156, and 166 to the base pad 114 of the substrate 111. The at least one first connection wiring 175 may electrically connect the substrate 111 with the first semiconductor chips 136, 146, 156, and 166.

The at least one second connection wiring 245 may be disposed at the one side of the second semiconductor chips 196, 206, 216, and 226 to be in contact with the connection pads 199, 209, 219, and 229 of the second semiconductor chips 196, 206, 216, and 226. The at least one second connection wiring 245 may electrically connect the second semiconductor chips 196, 206, 216, and 226 with each other.

The second connection wiring 245 may extend from the second semiconductor chips 196, 206, 216, and 226 to the base pad 118 of the substrate 111. The at least one second connection wiring 245 may electrically connect the substrate 111 with the second semiconductor chips 196, 206, 216, and 226. The semiconductor package structure 285 may further include a filling structure 275. The filling structure 275 may be disposed on the substrate 111 to cover the first and second semiconductor packages 185 and 255.

Next, a method of forming a semiconductor package structure according to example embodiments will be described in more detail with reference to FIGS. 13 to 18.

FIGS. 13 to 16 are cross-sectional views taken along line II-IP of FIG. 11 illustrating a method of forming a semiconductor package structure according to example embodiments. FIGS. 13 to 16 use like reference numerals for like members as shown in FIG. 12.

Figure 13:
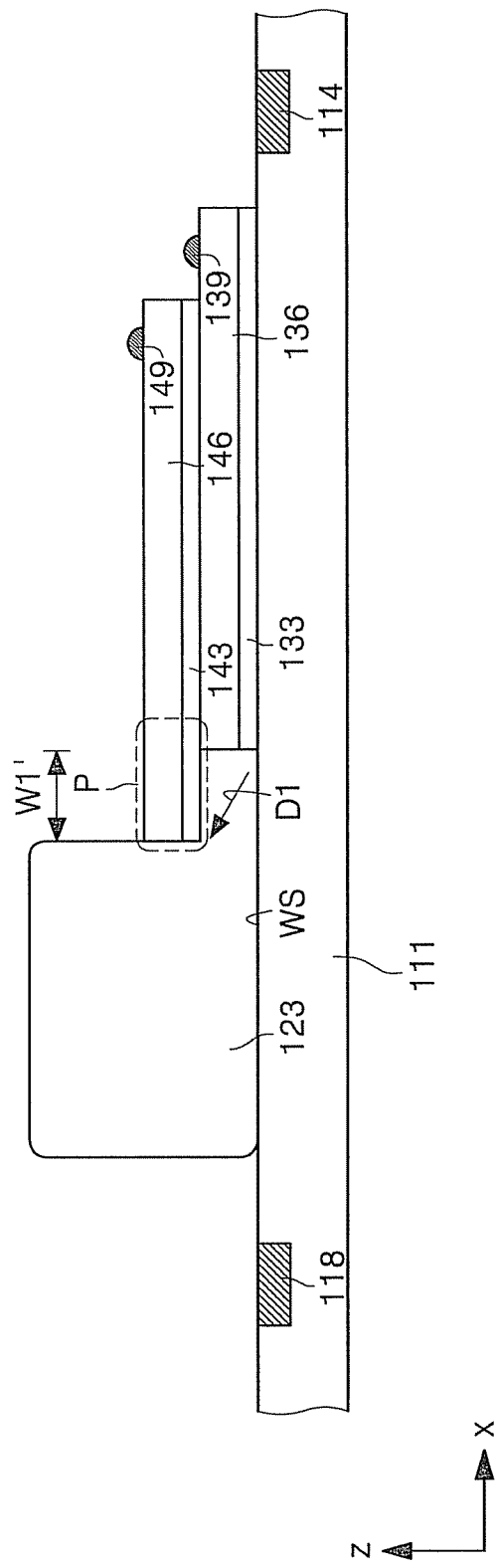
FIGS. 13 to 16 are cross-sectional views taken along line II-II' of FIG. 11 illustrating a method of forming a semiconductor package structure according to example embodiments.

Referring to FIG. 13, a substrate 111 may be prepared according to example embodiments. The substrate 111 may include a PCB. The substrate 111 may include an electric circuit (not shown) and base pads 114 and 118. The base pads 114 and 118 may be electrically connected with the electric circuit of the substrate 111. The base pads 114 and 118 may include a conductive material.

A first filling auxiliary structure 123 may be formed on the substrate 111. The first filling auxiliary structure 123 may expose the base pads 114 and 118. The first filling auxiliary structure 123 may include a sol or gel type insulating material.

A first-step adhesive member 133 and a first-step semiconductor chip 136 may be sequentially formed around the first filling auxiliary structure 123.

In this case, facing surfaces between the first filling auxiliary structure 123 and the first-step adhesive member and semiconductor chip 133 and 136 may be substantially parallel to each other. The first-step adhesive member 133 and the first-step semiconductor chip 136 may be formed to expose the base pads 114 and 118. In this case, the first-step adhesive member 133 and the first-step semiconductor chip 136 may be in contact with the first filling auxiliary structure 123 through one side thereof.

The first-step semiconductor chip 136 may include a connection pad 139 at the other side thereof. A second-step adhesive member 143 and a second-step semiconductor chip 146 may be sequentially formed on the first-step semiconductor chip 136 in the Z direction. In this case, the second-step adhesive member 143 and the second-step semiconductor chip 146 may protrude from the one side of the first-step adhesive member 133 and the first-step semiconductor chip 136 by a width W1' in the X direction. In example embodiments the width W1' may or may not be predetermined.

The second-step adhesive member 143 and the second-step semiconductor chip 146 may protrude from the one side of the first-step adhesive member 133 and the first-step semiconductor chip 136 by a different width from the predetermined width W1' in the X direction. In this case, the second-step adhesive member 143 and the second-step semiconductor chip 146 may have a protrusion portion P in contact with the first auxiliary structure 123 through one side thereof.

The second-step adhesive member 143 and the second-step semiconductor chip 146 may be formed to expose, the connection pad 139 of the first-step semiconductor chip 136. The second-step semiconductor chip 146 may include a connection pad 149 at the other side thereof. The protrusion portion P of the second-step adhesive member 143 and the second-step semiconductor chip 146 may apply a pressure on the first filling auxiliary structure 123 to transform and/or deform the first filling auxiliary structure 123.

The first-step and second-step adhesive members 133 and 143 and the first-step and second-step semiconductor chips 136 and 146 may form a first initial cascade shape at both sides thereof in a first direction D1 with respect to a working surface WS of the substrate 111. The first direction D1 of the first initial cascade shape may make an angle smaller than 90° with respect to the working surface WS of the substrate 111. Although example embodiments are illustrated with a first direction D1 having angle smaller than 90° with respect to the working surface WS of the substrate 111, example embodiments are not limited thereto. For example, the first direction may make an angle of 90° or larger with respect to the working surface WS of the substrate 111.

Each of the first-step and second-step semiconductor chips 136 and 146 may embody a non-volatile memory device or a volatile memory device through an internal circuit thereof. The internal circuit may be electrically connected with each of the connection pads 139 and 149. The first-step and second-step adhesive members 133 and 143 may include an insulating material.

Figure 14:
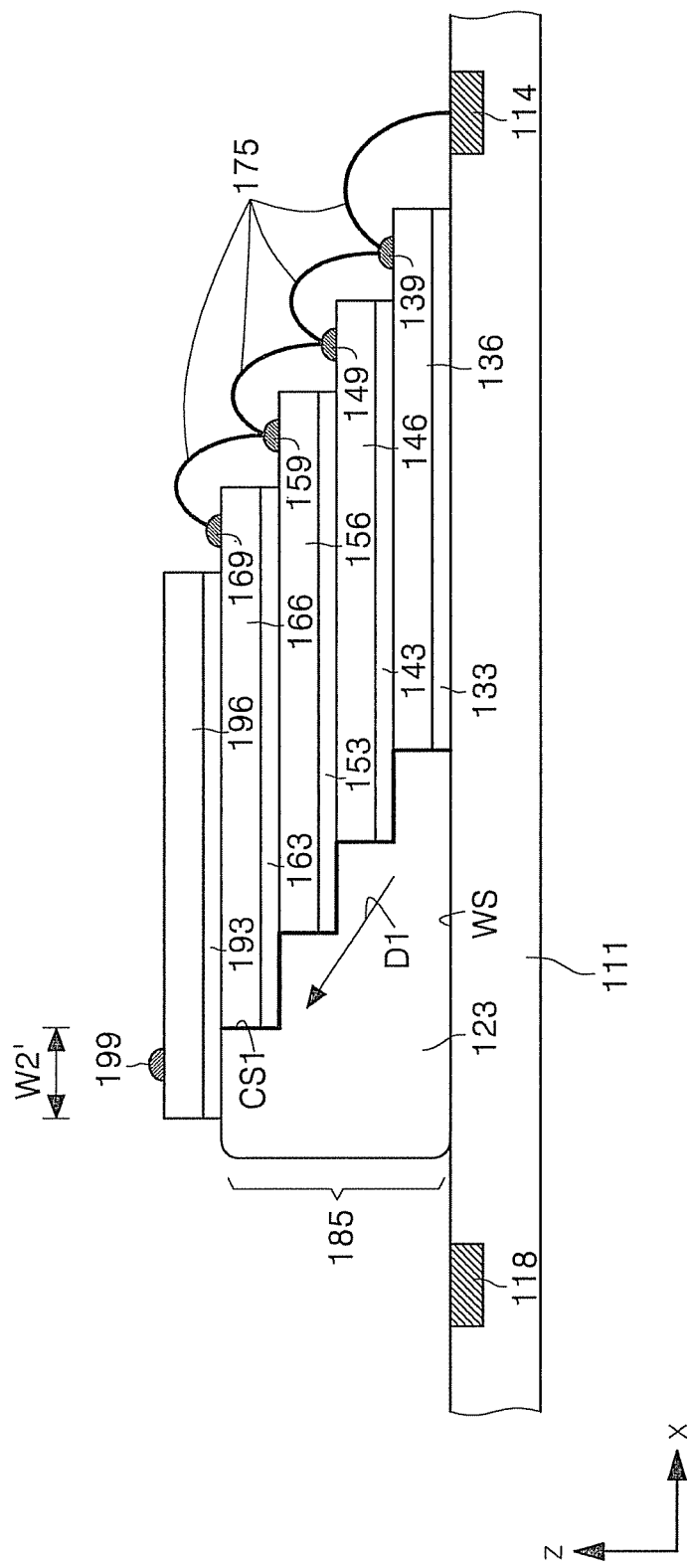

Referring to FIG. 14, a third-step adhesive member 153 and a third-step semiconductor chip 156 may be formed on the second-step semiconductor chip 146 in the Z direction. The third-step adhesive member 153 and the third-step semiconductor chip 156 may protrude from the one side of the second-step adhesive member 143 and the second-step semiconductor chip 146 by the width W1' of FIG. 13 in the X direction. In example embodiments, the width W1' may or may not be predetermined The third-step adhesive member 153 and the third-step semiconductor chip 156 may protrude from the one side of the second-step adhesive member 143 and the second-step semiconductor chip 146 by a width which is different from the width W1' of FIG. 13. In this case, the third-step adhesive member 153 and the third-step semiconductor chip 156 may be in contact with the first filling auxiliary structure 123 through one side thereof.

The third-step adhesive member 153 and the third-step semiconductor chip 156 may expose the connection pad 149 of the second-step semiconductor chip 146. The third-step semiconductor chip 156 may include a connection pad 159 disposed at the other side thereof. The third-step adhesive member 153 and the third-step semiconductor chip 156 may apply a pressure on the first filling auxiliary structure 123 to transform and/or deform the first filling auxiliary structure 123.

The third-step adhesive member 153 and the third-step semiconductor chip 156 may form first intermediate cascade shapes in the first direction D1 together with the first-step and second-step adhesive members 133 and 143 and the first-step and second-step semiconductor chips 136 and 146 at both sides thereof with respect to a working surface WS of the substrate 111. A fourth-step adhesive member 163 and a fourth-step semiconductor chip 166 may be formed on the third-step semiconductor chip 156 in the Z direction.

The fourth-step adhesive member 163 and the fourth-step semiconductor chip 166 may protrude from the one side of the third-step adhesive member 143 and the third-step semiconductor chip 146 by the width W1' of FIG. 13 in the X direction. The fourth-step adhesive member 163 and the fourth-step semiconductor chip 166 may protrude from the one side of the third-step adhesive member 153 and the third-step semiconductor chip 156 by a width which is different from the width W1' of FIG. 13.

The fourth-step adhesive member 163 and the fourth-step semiconductor chip 166 may expose the connection pad 159 of the third-step semiconductor chip 156. The fourth-step adhesive member 163 and the fourth-step semiconductor chip 166 may be in contact with the first filling auxiliary structure 123 through the one side thereof. The fourth-step semiconductor chip 166 may include a connection pad 169 at the other side thereof.

The fourth-step adhesive member 163 and the fourth-step semiconductor chip 166 may apply a pressure on the first filling auxiliary structure 123 to transform and/or deform the first filling auxiliary structure 123. In this case, the filling auxiliary structure 123 may protrude from the fourth-step adhesive member 163 and the fourth-step semiconductor chip 166. The first filling auxiliary structure 123 may not protrude from the fourth-step adhesive member 163 and the fourth-step semiconductor chip 166.

The fourth-step adhesive member 163 and the fourth-step semiconductor chip 166 may completely form first cascade shapes CS1 at both sides thereof together with the first-step to third-step adhesive members 133, 143, and 153 and the first-step to third-step semiconductor chips 136, 146, and 156. The first cascade shapes CS1 may be formed in the first direction D1 with respect to the working surface WS of the substrate 111.

Each of the third-step and fourth-step semiconductor chips 156 and 166 may embody a non-volatile memory device or a volatile memory device through an internal circuit thereof. The internal circuit may be electrically connected with each of the connection pads 159 and 169. The third-step and fourth-step adhesive members 153 and 163 may include an insulating material.

Accordingly, the first-step to fourth-step adhesive members 133, 143, 153, and 163 may constitute first adhesive members, and the first-step to fourth-step semiconductor chips 136, 146, 156, and 166 may constitute first semiconductor chips. Continuously, at least one first connection wiring 175 may be formed on the substrate 111 and the first adhesive members and semiconductor chips. In this case, the at least one first connection wiring 175 may be twined at the other side of the first adhesive members 133, 143, 153, and 163 and the first semiconductor chips 136, 146, 156, and 166.

The at least one first connection wiring 175 may be in contact with the base pad 114 of the substrate 111 and the connection pads 139, 149, 159, and 169 of the first-step to fourth-step semiconductor chips 136, 146, 156, and 166. The at least one first connection wiring 175 may include a conductive material. The first connection wiring 175 may constitute a first semiconductor package 185 according to example embodiments together with the first filling auxiliary structure 123, the first adhesive members 133, 143, 153, and 163 and the first semiconductor chips 136, 146, 156, and 166.

A fifth-step adhesive member 193 and a fifth-step semiconductor chip 196 may be sequentially formed on the first semiconductor package 185 in the Z direction. The fifth-step adhesive member 193 and the fifth-step semiconductor chip 196 may protrude from one side of the first adhesive members 133, 143, 153, and 163 and the first semiconductor chips 136, 146, 156, and 166 by a width W2' in the X direction. In example embodiments, the width W2' may or may not be predetermined. In more detail, the fifth-step adhesive member 193 and the fifth-step semiconductor chip 196 may be disposed on the fourth-step semiconductor chip 166 to be in contact with the first filling auxiliary structure 123.

The protruded width W2' of the fifth-step adhesive member 193 and the fifth-step semiconductor chip 196 may have the same width as or a different width from the protruded width W1' of the fourth-step adhesive member 163 and the fourth-step semiconductor chip 166. In this case, the first filling auxiliary structure 123 may be in contact with the fifth-step adhesive member 193 or the fifth-step adhesive member 193 and the fifth-step semiconductor chip 196 through the one side of the first semiconductor chips 136, 146, 156, and 166.

The fifth-step semiconductor chip 196 may include a connection pad 199 at one side thereof. The fifth-step adhesive member 193 and the fifth-step semiconductor chip 196 may expose the connection pad 169 of the fourth-step semiconductor chip 166 through the other side thereof. The fifth-step semiconductor chip 196 may embody a non-volatile memory device or a volatile memory device through an internal circuit thereof. The internal circuit may be electrically connected with the connection pad 199.

Figure 15:
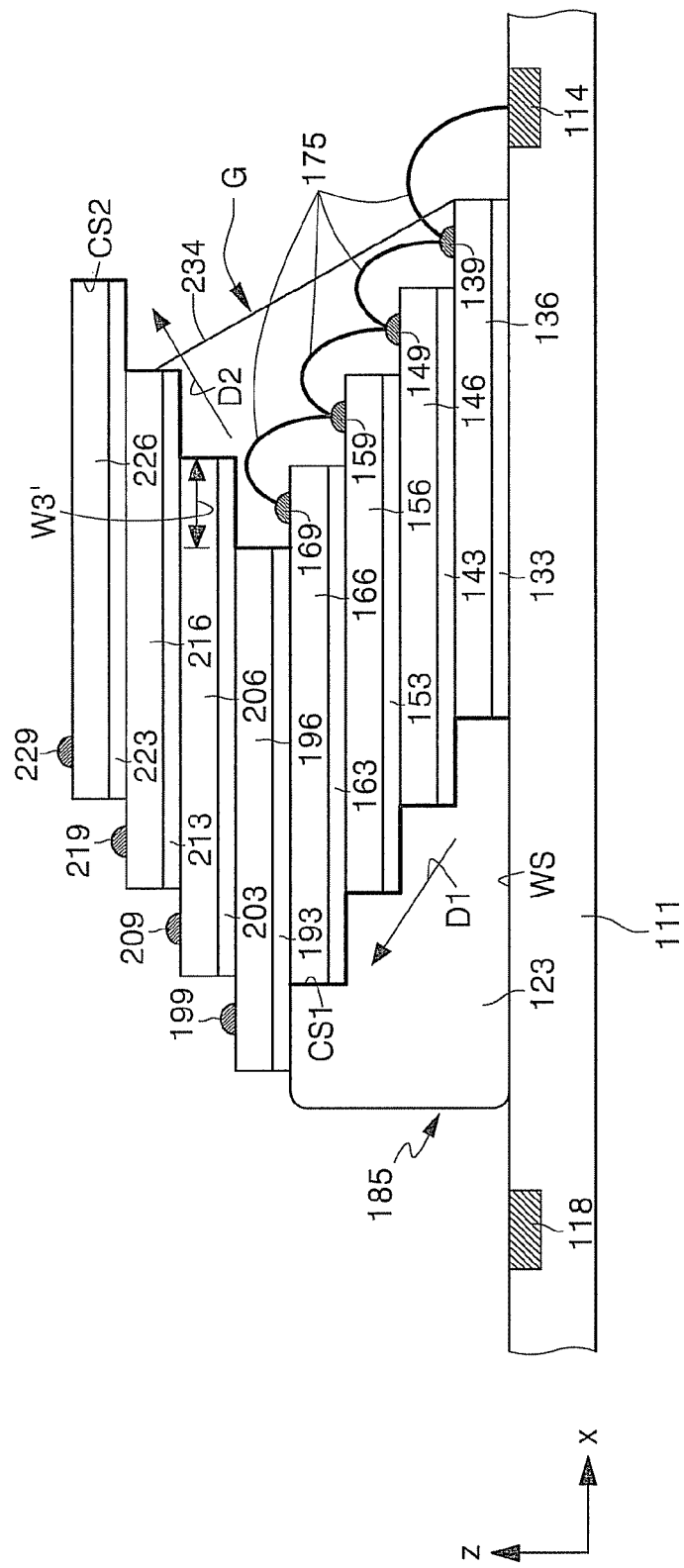

Referring to FIG. 15, sixth-step to eighth-step adhesive members 203, 213, and 223 and sixth-step to eighth-step semiconductor chips 206, 216, and 226 may be formed on the fifth-step semiconductor chip 196 in the Z direction. The sixth-step adhesive member 203 and the sixth-step semiconductor chip 206 may protrude from the other side of the fifth-step adhesive member 193 and the fifth-step semiconductor chip 196 by a width W3' in the X direction. In example embodiments, the width W3' may or may not be predetermined.

The sixth-step adhesive member 203 and the sixth-step semiconductor chip 206 may protrude from the other side of the fifth-step adhesive member 193 and the fifth-step semiconductor chip 196 by a width which is different from the predetermined width W3' in the X direction. The protruded width W3' of the sixth-step adhesive member 203 and the sixth-step semiconductor chip 206 may have the same width as or a different width from the protruded width W1' of the fourth-step adhesive member 163 and the fourth-step semiconductor chip 166 of FIG. 14.

The sixth-step adhesive member 203 and the sixth-step semiconductor chip 206 may expose the connection pad 199 of the fifth-step semiconductor chip 196 through one side thereof. The sixth-step semiconductor chip 206 may include a connection pad 209 at the one side thereof. A seventh-step adhesive member 213 and a seventh-step semiconductor chip 216 may be formed on the sixth-step semiconductor chip 206 in the Z direction.

The seventh-step adhesive member 213 and the seventh-step semiconductor chip 216 may protrude from the other side of the sixth-step adhesive member 203 and the sixth-step semiconductor chip 206 by a width W3' in the X direction. The seventh-step adhesive member 213 and the seventh-step semiconductor chip 216 may protrude from the other side of the sixth-step adhesive member 203 and the sixth-step semiconductor chip 206 by a width which is different from the width W3' in the X direction.

The seventh-step adhesive member 213 and the seventh-step semiconductor chip 216 may expose the connection pad 209 of the sixth-step semiconductor chip 206 through one side thereof. The seventh-step semiconductor chip 216 may include a connection pad 219 at the one side thereof. An eighth-step adhesive member 223 and an eighth-step semiconductor chip 226 may be aimed on the seventh-step semiconductor chip 216 in the Z direction.

The eighth-step adhesive member 223 and the eighth-step semiconductor chip 226 may protrude from the other side of the seventh-step adhesive member 213 and the seventh-step semiconductor chip 216 by a width W3 in the X direction. The eighth-step adhesive member 223 and the eighth-step semiconductor chip 226 may protrude from the other side of the seventh-step adhesive member 213 and the seventh-step semiconductor chip 216 by a width which is different from the width W3 in the X direction.

The eighth-step adhesive member 223 and the eighth-step semiconductor chip 226 may expose the connection pad 219 of the seventh-step semiconductor chip 216 through one side thereof. The eighth-step semiconductor chip 226 may include a connection pad 229 at the one side thereof. Accordingly, the fifth-step to eighth-step adhesive members 193, 203, 213, and 223 and the fifth-step to eighth-step semiconductor chips 196, 206, 216, and 226 may form second cascade shapes CS2 in a second direction D2 at both sides with respect to a working surface WS of the substrate 111.

In this case, an angle between the first direction D1 of FIG. 14 and the second direction D2 of FIG. 15 may be smaller than 180°. Each of the fifth-step to eighth-step semiconductor chips 196, 206, 216, and 226 may embody a non-volatile memory device or a volatile memory device through an internal circuit thereof. The internal circuits may be electrically connected with each of the connection pads 199, 209, 219, and 229.

Furthermore, the first-step to eighth-step adhesive members 133, 143, 153, 163, 193, 203, 213, and 223 and the first-step to eighth-step semiconductor chips 136, 146, 156, 166, 196, 206, 216, and 226 may form a groove G at the other side thereof. The groove G may be defined by the first and second cascade shapes CS1 and CS2 of the first-step to eighth-step adhesive members 133, 143, 153, 163, 193, 203, 213, and 223 and the first-step to eighth-step semiconductor chips 136, 146, 156, 166, 196, 206, 216, and 226.

A second filling auxiliary structure 234 may be formed in the groove. The second filling auxiliary structure 234 may include the same insulating material as or a different insulating material from the first filling auxiliary structure 123 of FIG. 13. The second filling auxiliary structure 234 may partially fill the groove G. In this case, the second filling auxiliary structure 234 may be partially or sufficiently in contact with the second-step to seventh-step adhesive members 143, 153, 163, 193, 203, and 213 and the first-step to seventh-step semiconductor chips 136, 146, 156, 166, 196, 206, and 216.

To this end, the second filling auxiliary structure 234 may expose at least one of the first-step to eighth-step adhesive members 133, 143, 153, 163, 193, 203, 213, and 223. The second filling auxiliary structure 234 may also expose at least one of the first-step to eighth-step semiconductor chips 136, 146, 156, 166, 196, 206, 216, and 226.

Further, the second filling auxiliary structure 234 may also expose at least one of the first-step to eighth-step adhesive members 133, 143, 153, 163, 193, 203, 213, and 223 and the first-step to eighth-step semiconductor chips 136, 146, 156, 166, 196, 206, 216, and 226. The second filling auxiliary structure 234 may be replaced with the second filling auxiliary structure 232 of FIG. 12. The second filling auxiliary structure 234 may partially cover the at least one first connection wiring 175.

However, example embodiments are not limited thereto. For example, the second filling structure 234 may completely fill the groove G. Thus, the second filling structure 234 may sufficiently in contact with the first-step to eighth-step adhesive members 133, 143, 153, 163, 193, 203, 213, and 223 and the first-step to eighth-step semiconductor chips 136, 146, 156, 166, 196, 206, 216, and 226.

The second filling auxiliary structure 234 may include at least one supporting member. In this case, the first filling auxiliary structure 123 of FIG. 14, and the second filling auxiliary structure 234 may include a chemically stable material which is nonreactive to the first-step to eighth-step adhesive members 133, 143, 153, 163, 193, 203, 213, and 223. The fifth-step to eighth-step adhesive members 193, 203, 213, and 223 may constitute second adhesive members. The fifth-step to eighth-step semiconductor chips 196, 2006, 216, and 226 may constitute second semiconductor chips.

Figure 16:
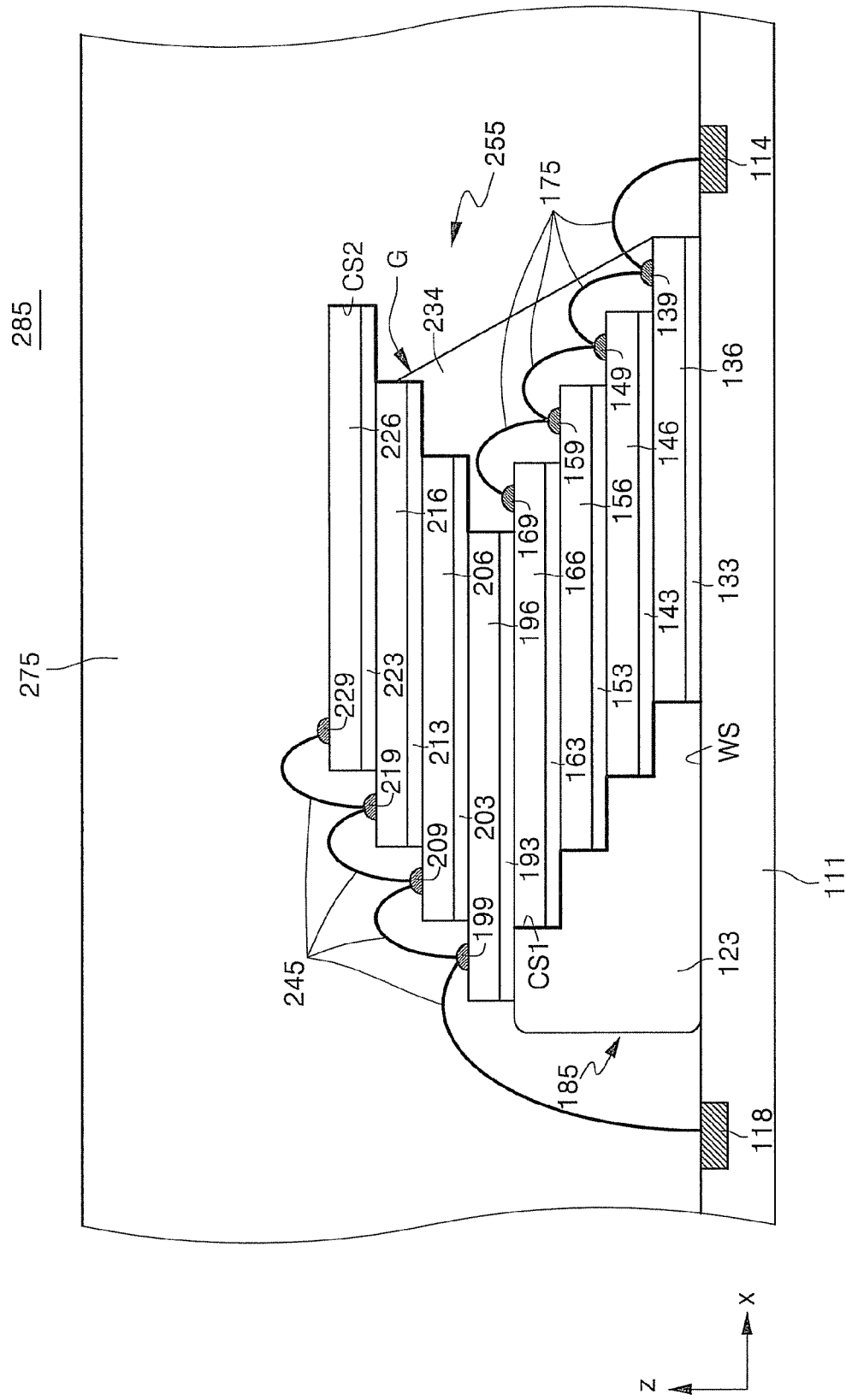

Referring to FIG. 16, at least one second connection wiring 245 may be formed on the substrate 111 and the second adhesive members and semiconductor chips. The at least one second connection wiring 245 may be formed at the one side of the fifth-step to eighth-step adhesive members 193, 203, 213, and 223 and the fifth-step to eighth-step semiconductor chips 196, 206, 216, and 226.

The at least one second connection wiring 245 may be in contact with the base pad 118 of the substrate 111 and the connection pads 199, 209, 219, and 229 of the fifth-step to eighth-step semiconductor chips 196, 206, 216, and 226. The at least one second connection wiring 245 may include the same conductive material as or a different conductive material from the first connection wiring 175 of FIG. 14. The at least one second connection wiring 245 may constitute a second semiconductor package 255 according to example embodiments together with the second filling auxiliary structure 234, the second adhesive members 193, 203, 213, and 223 and the second semiconductor chips 196, 206, 216, and 226.

A filling structure 275 may be formed on the substrate 111. In a first case where the second filling auxiliary structure 234 is sufficiently in contact with the first and second adhesive members 133, 143, 153, 163, 193, 203, 213, and 223 and the first and second semiconductor chips 136, 146, 156, 166, 196, 206, 216, and 226 and partially fills the groove G, the profile of the filling structure 275 will be described as follows. For example, in the first case, a concave shape may correspond to a surface or a sidewall of the second filling auxiliary structure 234 in the Z direction. The filling structure 275 may cover the first and second filling auxiliary structures 123 and 234, the first and second adhesive members 133, 143, 153, 163, 193, 203, 213, and 223, the first and second semiconductor chips 136, 146, 156, 166, 196, 206, 216, and 226, and the first and second connection wirings 175 and 245.

In a second case where the second filling auxiliary structure 234 is partially in contact with the first and second adhesive members 133, 143, 153, 163, 193, 203, 213, and 223 and the first and second semiconductor chips 136, 146, 156, 166, 196, 206, 216, and 226 and partially fills the groove G, the profile of the filling structure 275 will be described below. For example, in the second case, two or more supporting members such as the supporting members 126 and 129 of FIG. 17 may correspond to the second filling auxiliary structure 234.

The filling structure 275 may be filled between the second filling auxiliary structure 234, the first and second adhesive members 133, 143, 153, 163, 193, 203, 213, and 223 and the first and second semiconductor chips 136, 146, 156, 166, 196, 206, 216, and 226. Furthermore, the filling structure 275 may cover the first and second filling auxiliary structures 123 and 234, the first and second adhesive members 133, 143, 153, 163, 193, 203, 213, and 223, the first and second semiconductor chips 136, 146, 156, 166, 196, 206, 216, and 226, and the first and second connection wirings 175 and 245. Accordingly, the first and second semiconductor packages 185 and 255 may constitute a semiconductor package structure 285 together with the substrate 111 and the filling structure 275.

Figure 17:
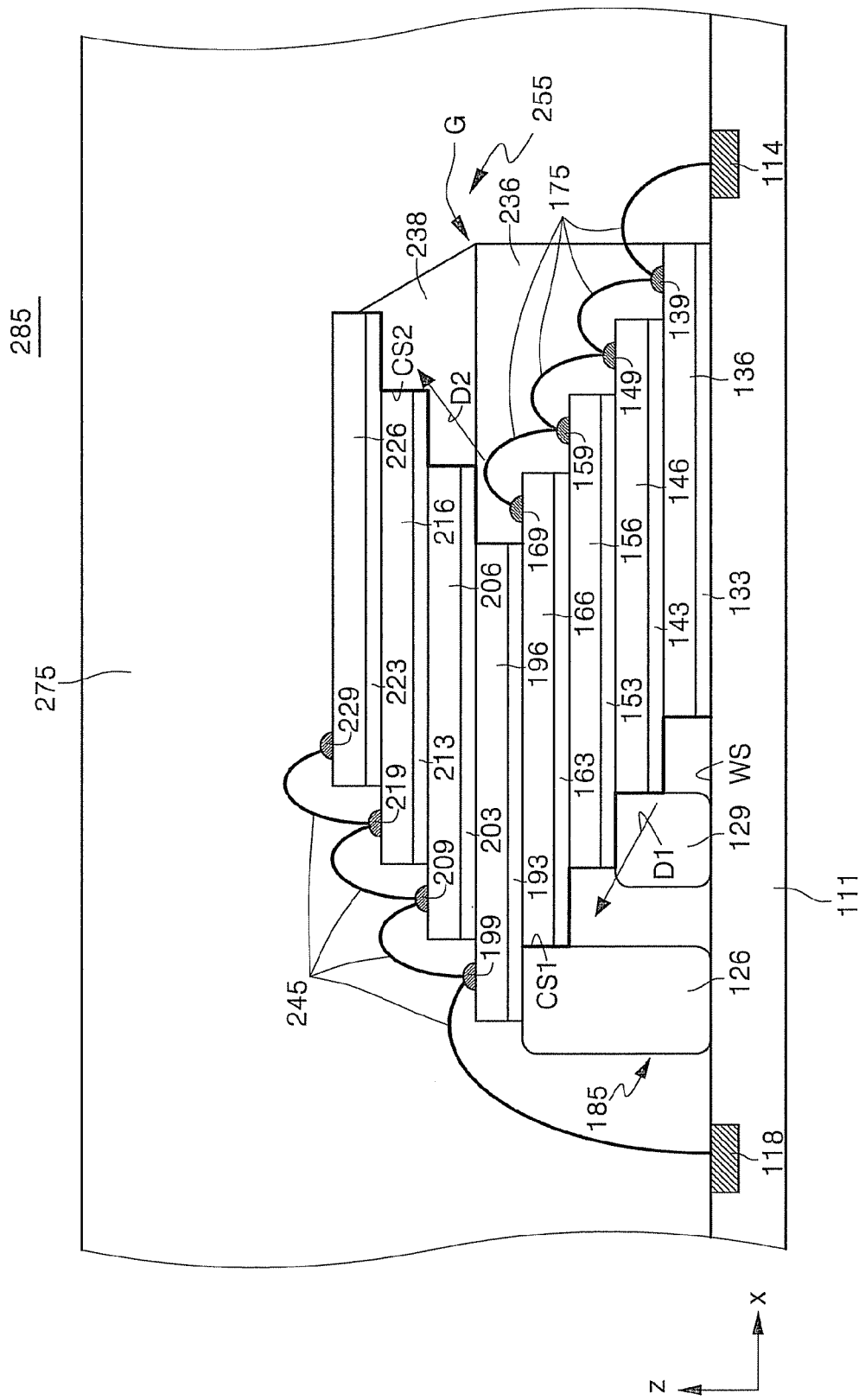
FIG. 17 is a cross-sectional view taken along line I-II' of FIG. 11 illustrating a semiconductor package structure according to example embodiments.

FIG. 17 is a cross-sectional view taken along line II-IP of FIG. 11 illustrating a semiconductor package structure according to example embodiments. FIG. 17 uses like reference numerals for like members as shown in FIGS. 13 to 16.

Referring to FIG. 17, a first filling auxiliary structure may be formed on the substrate 111 according to example embodiments. The filling auxiliary structure may include two supporting members 126 and 129 which may be disposed parallel to a working surface WS of the substrate 111. The filling auxiliary structure 126 and 129 may include two or more supporting members. The first auxiliary structure 126 and 129 may include an insulating material.

The first adhesive members 133, 143, 153, and 163 and the first semiconductor chips 136, 146, 156, and 166 of FIG. 17 may formed on the substrate 111. The first adhesive members 133, 143, 153, and 163 and the first semiconductor chips 136, 146, 156, and 166 may cover the first auxiliary structure 126 and 129 through one side thereof. The first adhesive members 133, 143, 153, and 163 and the first semiconductor chips 136, 146, 156, and 166 may be disposed in the first direction D1 of FIG. 17 with respect to the working surface WS of the substrate 111.

The first adhesive members 133, 143, 153, and 163 and the first semiconductor chips 136, 146, 156, and 166 may have the first cascade shapes CS1 of FIG. 17 in the first direction D1 at both sides thereof. The first cascade shapes CS1 of the first adhesive members 133, 143, 153, and 163 and the first semiconductor chips 136, 146, 156, and 166 may be partially exposed through the first filling auxiliary structure 126 and 129. At least one first connection wiring 175 may be formed on the other side of the first adhesive members 133, 143, 153, and 163 and the first semiconductor chips 136, 146, 156, and 166. The at least one first connection wiring 175 may electrically connect the base pad 114 of the substrate 111 with the connection pads 139, 149, 159, and 169 of the first semiconductor chips 136, 146, 156, and 166.

The at least one first connection wiring 175 may constitute a semiconductor package 185 according to example embodiments together with the first filling auxiliary structure 126 and 129, the first adhesive members 133, 143, 153, and 163 and the first semiconductor chips 136, 146, 156, and 166. In example embodiments, second adhesive members 193, 203, 213, and 223 and second semiconductor chips 196, 206, 216, and 226 may be formed on the first semiconductor package 185.

The second semiconductor chips 196, 206, 216, and 226 may be disposed in the second direction D2 of FIG. 17 with respect to the working surface WS of the substrate 111. The second semiconductor chips 196, 206, 216 and 226 may protrude from the both sides of the first semiconductor chips 136, 146, 156, and 166. The second adhesive members 193, 203, 213, and 223 and the second semiconductor chips 196, 206, 216, and 226 may have the second cascade shapes CS2 of FIG. 17 at the both sides thereof in the second direction D2.

The second adhesive members 193, 203, 213, and 223 and the second semiconductor chips 196, 206, 216, and 226 may form a groove G together with the first adhesive members 133, 143, 153, and 163 and the first semiconductor chips 136, 146, 156, and 166. The groove may be defined by the first and second cascade shapes CS1 and CS2 on the other side of the first adhesive members 133, 143, 153, and 163 and the first semiconductor chips 136, 146, 156, and 166.

A second filling auxiliary structure may be formed in the groove. The second filling auxiliary structure may include two supporting members 236 and 238. The second filling auxiliary structure may include two or more supporting members. The second filling auxiliary structure 236 and 238 may include an insulating material. The second filling auxiliary structure 236 and 238 may partially, sufficiently, or completely fill the groove G.

So as to partially fill the groove, the second filling auxiliary structure 236 and 238 may embody a first case in which the second filling auxiliary structure 236 and 238 is sufficiently in contact with the first and second adhesive members 143, 153, 163, 193, 203, 213, and 223 and the first and second semiconductor chips 136, 146, 156, 166, 196, 206, 216, and 226. For example, in the first case, a concave shape may correspond to a surface or a sidewall of the second filling auxiliary structure 236 and 238 in the Z direction. Next, the second filling auxiliary structure 236 and 238 may embody a second case in which the second filling auxiliary structure 236 and 238 is partially in contact with the first and second adhesive members 133, 143, 153, 163, 193, 203, 213, and 223 and the first and second semiconductor chips 136, 146, 156, 166, 196, 206, 216, and 226. For example, in the second case, two or more supporting members such as the first filling auxiliary structures 126 and 127 of FIG. 17 may correspond to the second filling auxiliary structure 236 and 238.

The second filling auxiliary structure 236 and 238 like the second filling auxiliary structure 234 of FIG. 16 may partially fill the groove in the first or second case. The first and second filling auxiliary structure 126, 129, 236 and 238 may include a chemically stable material which is nonreactive to the first and second adhesive members 133, 143, 153, 163, 193, 203, 213, and 223. At least one second connection wiring 245 may be formed on the one side of the second adhesive members 193, 203, 213, and 223 and the second semiconductor chips 196, 206, 216, 226.

The at least one second connection wiring 245 may electrically connect the base pad 118 of the substrate 111 with the connection pads 199, 209, 219, and 229 of the second semiconductor chips 196, 206, 216, and 226. Accordingly, the at least one second connection wiring 245 may constitute a second semiconductor package 255 according to example embodiments together with the second adhesive members 193, 203, 213, and 223, the second semiconductor chips 196, 206, 216, and 226, and the second filling auxiliary structure 236 and 238.

A filling structure 275 may formed on the substrate 111. If the second filling auxiliary structure 236 and 238 sufficiently fill the groove or are formed as the first case, the filling structure 275 may fill between the first adhesive members 133, 143, 153, and 163, the first semiconductor chips 136, 146, 156, and 166, and the first filling auxiliary structure 126 and 129. Furthermore, the filling structure 275 may cover the first and second filling auxiliary structures 126, 129, 236, and 238, the first and second adhesive members 133, 143, 153, 163, 193, 203, 213, and 223, the first and second semiconductor chips 136, 146, 156, 166, 196, 206, 216, and 226, and the first and second connection wirings 175 and 245.

If the second filling auxiliary structure 236 and 238 are formed in the groove as the second case, the filling structure 275 may fill between the first and second adhesive members 133, 143, 153, 163, 193, 203, 213, and 223, the first and second semiconductor chips 136, 146, 156, 166, 196, 206, 216, and 226, and the first and second filling auxiliary structures 126, 129, 236, and 238. Further more, the filling structure 275 may cover the first and second filling auxiliary structures 126, 129, 236, and 238, the first and second adhesive members 133, 143, 153, 163, 193, 203, 213, and 223, the first and second semiconductor chips 136, 146, 156, 166, 196, 206, 216, and 226, and the first and second connection wirings 175 and 245.

Accordingly, the first and second semiconductor packages 185 and 255 may constitute a semiconductor package structure 285 according to example embodiments with the substrate 111 and the filling structure 275.

Figure 18:
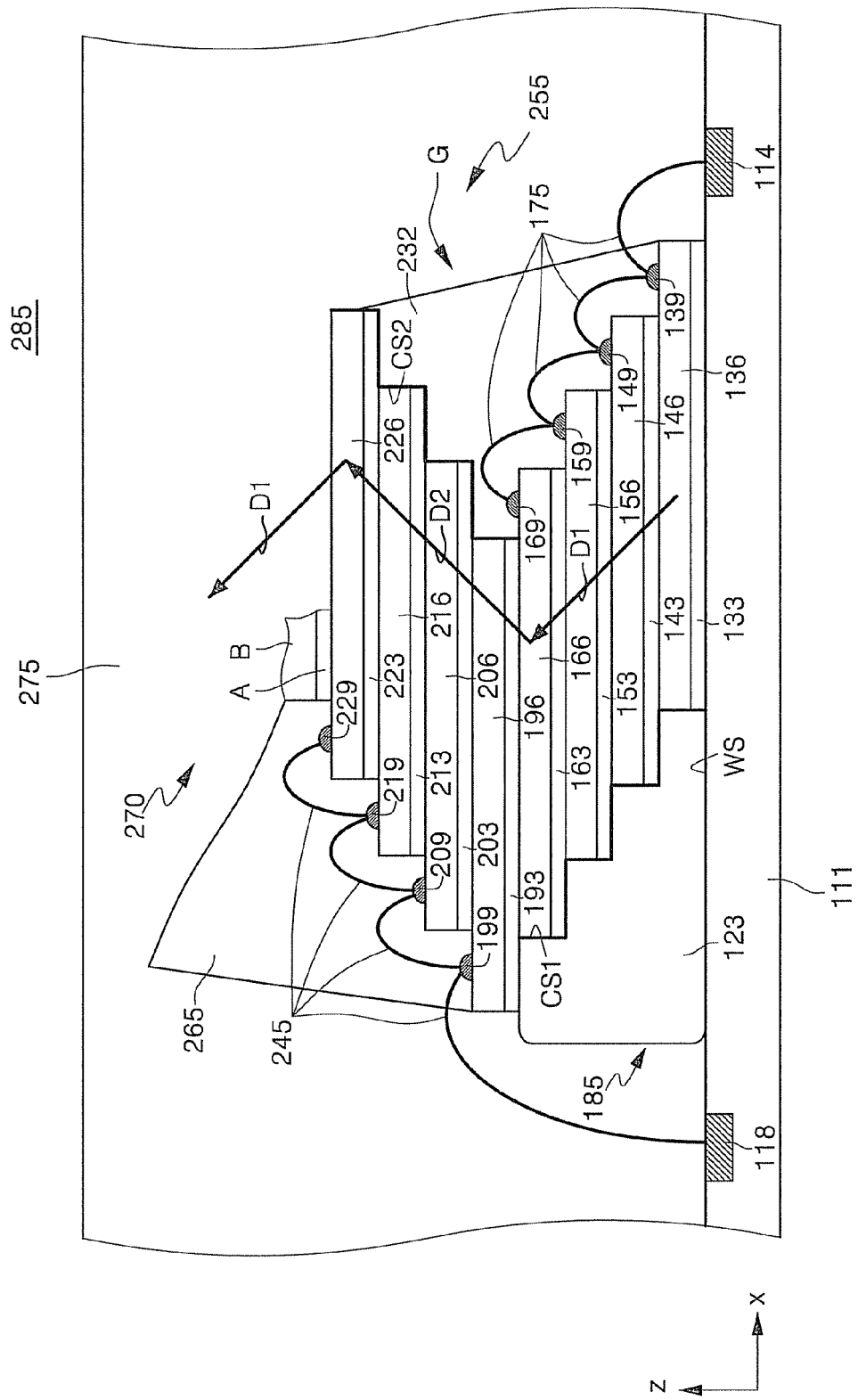
FIG. 18 is a cross-sectional view taken along line I-II' of FIG. 11 illustrating a semiconductor package structure according to example embodiments.

FIG. 18 is a cross-sectional view taken along line II-II' of FIG. 11 illustrating a semiconductor package structure according to example embodiments. FIG. 18 uses like reference numerals for like members as shown in FIGS. 13 to 16.

Referring to FIG. 18, the first semiconductor package 185 of FIG. 14 and the second semiconductor package 255 of FIG. 12 may be sequentially formed on the substrate 111. The first semiconductor package 185 may include a first filling auxiliary structure 123, first adhesive members 133, 143, 153, and 163, first semiconductor chips 136, 146, 156, and 166 and at least one first connection wiring 175. In this case, the first filling auxiliary structure 123 may be replaced with the first filling auxiliary structures 126 and 129 of FIG. 17.

The first filling auxiliary structure 123 may be formed at one side of the first adhesive members 133, 143, 153, and 163 and the first semiconductor chips 136, 146, 156, and 166. The first adhesive members 133, 143, 153, and 163 and the first semiconductor chips 136, 146, 156, and 166 may be formed in the first direction D1 of FIG. 18 with respect to the working surface WS of the substrate 111. The first connection wiring 175 may be formed on the other side of the first adhesive members 133, 143, 153, and 163 and the first semiconductor chips 136, 146, 156, and 166.

The second semiconductor package 255 may include second adhesive members 193, 203, 213, and 223, second semiconductor chips 196, 206, 216, and 226, a second filling auxiliary structure 232, and at least one second connection wiring 245. In this case, the second filling auxiliary structure 232 may be similar to the second filling auxiliary structure 234 of FIG. 16 or the second filling auxiliary structures 236 and 238 of FIG. 17. The second filling auxiliary structure 232 may be formed on the other side of the first adhesive members 143, 153, and 163 and the first semiconductor chips 136, 146, 156, and 166. However, example embodiments are not limited thereto. For example, the second filling auxiliary structure 232 may be formed on the other side of the first adhesive members 143, 153, and 163 and the first semiconductor chips 133, 136, 146, 156, and 166.

The second filling auxiliary structure 232 may sufficiently fill a first groove G between the first adhesive members 133, 143, 153, and 163, the first semiconductor chips 136, 146, 156, and 166, the second adhesive members 193, 203, 213, and 223 and the second semiconductor chips 196, 206, 216, and 226. The second filling auxiliary structure 232 may partially cover the first connection wiring 175.

The second adhesive members 193, 203, 213, and 223 and the second semiconductor chips 196, 206, 216, and 226 may be formed in the second direction D2 of FIG. 18 with respect to the working surface WS of the substrate 111. The at least one second connection wiring 245 may be formed on the one side of the first adhesive members 133, 143, 153, and 163 and the first semiconductor chips 136, 146, 156, and 166. Then, a third package 270 may be formed on the second semiconductor package 255.

The third package 270 may include a third adhesive member A, a third semiconductor chip and a third filling auxiliary structure 265. The third adhesive member A may be stacked within the third semiconductor package 270 by the same number as the first adhesive members 133, 143, 153, and 163 The third semiconductor chip B may be stacked within the third semiconductor package 270 by the same number as the first semiconductor chips 136, 146, 156 and 166.

In this case, the third adhesive member A and the third semiconductor chip B may be alternatively and repeatedly stacked several times within the third semiconductor package 270 in the direction D1 to have the first cascade shape CS1 of the first adhesive members 133, 143, 153, and 163 and the first semiconductor chips 136, 146, 156, and 166 as shown in FIG. 18.

The third adhesive member and the semiconductor chip A and B may form a second groove (not shown) on one side of the first adhesive members 133, 143, 153, and 163 and the first semiconductor chips 136, 146, 156, and 166 by being combined in plurality with the second adhesive members 193, 203, 213, and 223 and the second semiconductor chips 196, 206, 216, and 226.

The third adhesive member A may include an insulating material. The third semiconductor chip B may embody a non-volatile memory device or a volatile memory device through an internal circuit thereof. The third filling auxiliary structure 265 may include an insulating material. The third filling auxiliary structure 265 may be formed in the second groove.

The third filling auxiliary structure 265 may partially or sufficiently fill the second groove. In case where the third filling auxiliary structure 265 partially fills the second groove, the third filling auxiliary structure 265 may be like the second filling auxiliary structure 234 of FIG. 16. In the alternative, the third filling auxiliary structure 265 may be formed within the second groove and may resemble the second filling auxiliary structure 236 and 238 of FIG. 17, or 232 of FIG. 18. The third filling auxiliary structure 265 may include at least one supporting member.

In this case, the first to third filling auxiliary structures 123, 232, and 265 may include a chemically stable material which is nonreactive to the first to third adhesive members 133, 143, 153, 163, 193, 203, 213, 223 and A. The third filling auxiliary structure 265 may partially cover the second connection wiring 245. A filling structure 275 may be formed on the substrate 111. The filling structure 275 may cover the first to third semiconductor packages 185, 255 and 270, the first connection wiring 175, and the second connection wiring 245.

The filling structure 275 may constitute a semiconductor package structure 285 according to example embodiments together with the substrate 111, and the first to third semiconductor packages 185, 255 and 270. The semiconductor package structure 285 may correspond Nth semiconductor chips to the first direction D1 and may correspond N+1th semiconductor chips to the second direction D2 (N being an odd number)

The semiconductor package structure 285 may correspond the Nth semiconductor chips to the second direction D2 and correspond the N+1th semiconductor chips to the first direction D1 (N being an odd number). The semiconductor package structure 285 may correspond an Nth filling auxiliary structure to the one side of Nth and N+1th semiconductor chips and correspond an N+1th filling auxiliary structure to the other side of the Nth and N+1th semiconductor chips. (N being an odd number).

Figure 19:
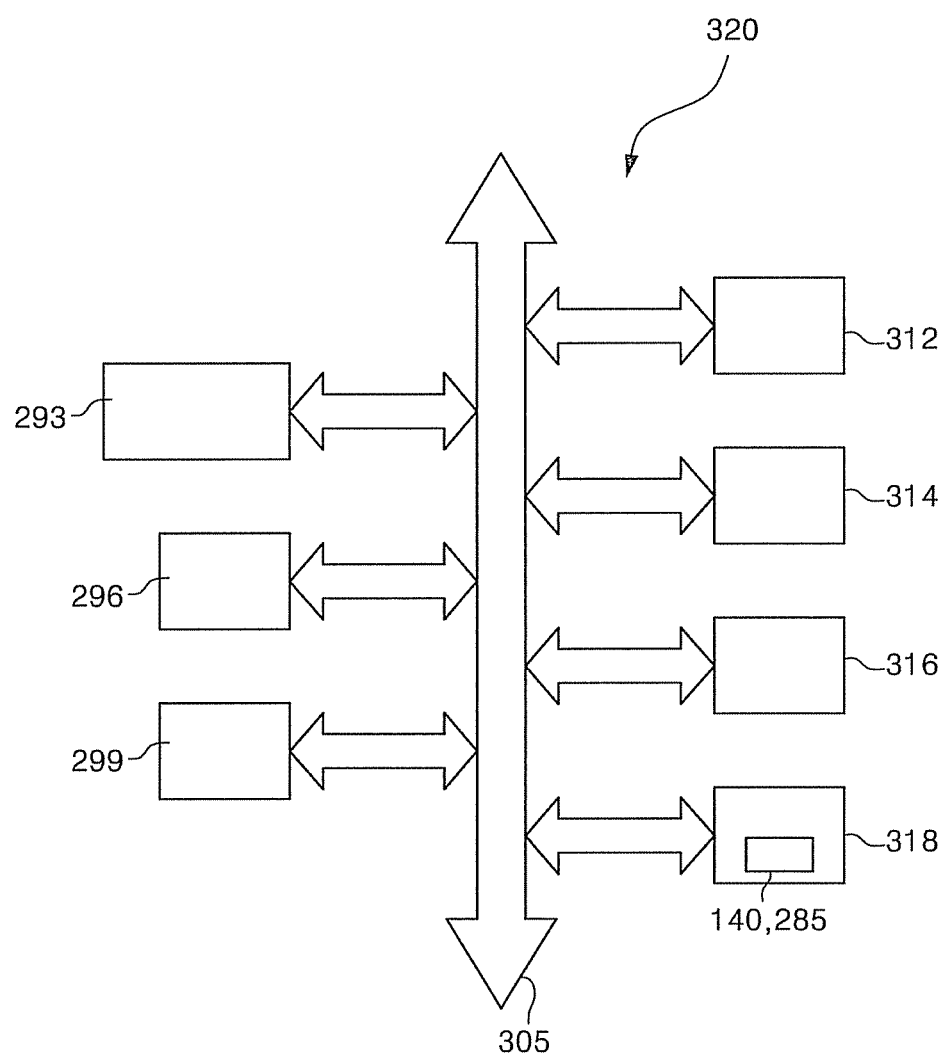
FIG. 19 is a plan view of a processor-based system including a semiconductor package structure according to example embodiments.

FIG. 19 is a plan view of a processor-based system including a semiconductor package structure according to example embodiments.

Referring to FIG. 19, a processor-based system 320 may include at least one system board (not shown). The system board may include at least one bus line 305. A first module unit may be disposed on the bus line 305. The first module unit may be electrically connected with the bus line 305.

The first module unit may include a central processing unit (CPU) 293, a floppy disc drive 296 and a compact disc ROM drive 299. Furthermore, a second module unit may be disposed on the bus line 305. The second module unit may be electrically connected with the bus line 305.

The second module unit may include a first I/O device 312, a second I/O device 314, a read-only memory (ROM) 316 and a random access memory (RAM) 318. The RAM 318 may include the semiconductor package structure 140 or 285 of FIG. 1 or 11. The semiconductor package structure 140 or 285 may also be disposed in the first module unit and/or the second module unit besides the RAM 318.

Accordingly, the processor-based system 320 may have improved electrical characteristics compared to the related art. The processor-based system 320 may include a computer system, a process control system, or other systems.

Figure 20:
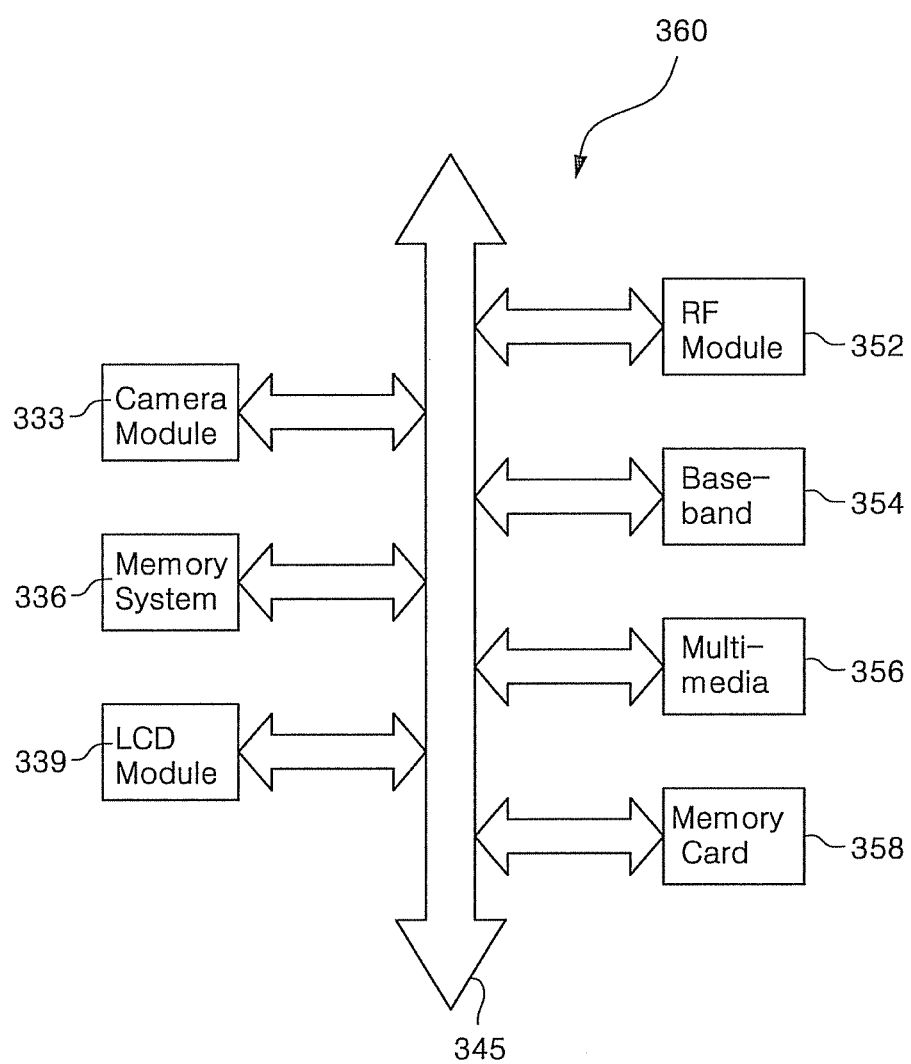
FIG. 20 is a plan view of a mobile phone including a semiconductor package structure according to example embodiments.

FIG. 20 is a plan view of a mobile phone including a semiconductor package structure according to example embodiments.

Referring to FIG. 20, a mobile phone 360 according to example embodiments may include a driving unit and a memory card 358. The driving unit may include a camera module 333, a memory system 336, a liquid crystal display (LCD) module 339, a radio frequency (RF) module 352, a baseband module 354, and a multimedia module 356. The camera module 333 may include a lens, a complementary metal oxide semiconductor (CMOS)/charge coupled device (CCD) imager, and a camera digital signal processor (DSP).

The memory system 336 may include a non-memory device and/or a memory device in order to perform a storage function related to the driving unit. The LCD module 339 may include an LCD panel, an LCD driver, an LCD controller, and a gray scale integrated circuit (IC). The RF module 352 may include RF elements, a power amplifier, and an IF/RF. The baseband module 354 may include an application specific integrated circuit (ASIC) and a central processing unit (CPU).

The multimedia module 356 may have MPEG4 and Bluetooth. The memory card 358 may be electrically connected with the camera module 333, the memory system 336, and the LCD module 339 through a common line 345. The memory card 358 may be continuously electrically connected with the RF module 352, the baseband module 354, and the multimedia module 356 through the common line 345.

The memory card 358 may include the semiconductor package structure 140 of FIG. 5, 6, 7, 8, 9, or 10. The semiconductor package structure 140 does not have a void of the filling structure 130 around the first to fourth adhesive members 20, 90, 100, and 110 and the first to fourth semiconductor chips 25, 95, 105, and 115. Therefore, the first to fourth adhesive members 20, 90, 100, and 110 and the first to fourth semiconductor chips 25, 95, 105, and 115 are not inclined with respect to the substrate 10.

Besides, the memory card 358 may include the semiconductor package structure 285 of FIG. 11. The semiconductor package structure 285 may prevent cracks from occurring at both sides of the first and second semiconductor chips 136, 146, 156, 166, 196, 206, 216, and 226 using the filling auxiliary structure of FIG. 12, 16, 17, or 18. The semiconductor package 140 or 285 may disposed in the driving unit. Accordingly, the semiconductor package 140 or 285 may provide desired capacity of data storage to the memory card 358 as compared with the prior art.

As described above, a semiconductor package according to example embodiments does not have a void which may be generated around semiconductor chips when cascade shapes are formed at both sides of the semiconductor chips. The void can be removed through at least one filling auxiliary structure located around the semiconductor chips. The at least one filling auxiliary structure can prevent or retard the semiconductor chips from being inclined toward a substrate. Therefore, the semiconductor chips can be stably and electrically connected with the substrate due to the filling auxiliary structure compared to the prior art.

A mobile phone according to example embodiments may include the semiconductor package structure having the at least one filling auxiliary structure. The semiconductor package structure may include the semiconductor chips and a substrate which are electrically and stably connected with each other and thus can improve electrical characteristics of the mobile phone. The mobile phone can stably have a desired memory capacity due to the semiconductor package structure. Therefore, the mobile phone can store image or voice data in the semiconductor package with relatively high reliability compared to the prior art.

The foregoing is illustrative of example embodiments and is not to be construed as limiting thereof. Although example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to example embodiments disclosed, and that modifications to the disclosed embodiments, as well as other embodiments, are intended to be included within the scope of the appended claims.

What is claimed is:

1. A semiconductor package structure, comprising:
    a first semiconductor package having first semiconductor chips sequentially stacked on a substrate, the first semiconductor chips having a cascaded arrangement in which first sides and second sides of the semiconductor chips define cascade patterns, the cascaded arrangement extending in a first direction to define a space between the first sides of the first semiconductor chips and the substrate;
    at least one first connection wiring at the second sides of the semiconductor chips, the at least one first connection wiring being configured to electrically connect the substrate with the first semiconductor chips; and
    a first filling auxiliary structure adjacent to at least one of the first sides of the first semiconductor chips, the first filling auxiliary structure confined in the space.

2. The semiconductor package structure of claim 1, wherein the first filling auxiliary structure partially fills the space.

3. The semiconductor package structure of claim 1, wherein the first filling auxiliary structure completely fills the space.

4. The semiconductor package structure of claim 1, wherein the first filling auxiliary structure has an inclined corner in at least one of the first semiconductor chips.

5. The semiconductor package structure of claim 1, wherein at least one of the first semiconductor chips includes an opening which is enclosed by the first filling auxiliary structure.

6. The semiconductor package structure of claim 1, wherein the first filling auxiliary structure is below the first semiconductor chips and has a substantially constant thickness.

7. The semiconductor package structure of claim 1, wherein the first filling auxiliary structure is below the first semiconductor chips and has a shape which is tapered toward the second sides of the first semiconductor chips from the first sides of the first semiconductor chips.

8. The semiconductor package structure of claim 1, further comprising:
a second semiconductor package on the first semiconductor package, the second semiconductor package including second semiconductor chips having a cascaded arrangement in which first sides and second sides of the second semiconductor chips define cascade patterns extending in a second direction; and
a second filling auxiliary structure on the second sides of the first semiconductor chips and being partially in contact with the first and the second semiconductor chips.

9. The semiconductor package structure of claim 8, wherein the second semiconductor package protrudes away from the second sides of the first semiconductor chips.

10. The semiconductor package structure of claim 9, wherein
the first direction makes an angle smaller than 90° with respect to a surface of the substrate and an angle between the first direction and the second direction is smaller than 180°,
the second sides of the first and second semiconductor packages define a first groove, and
the second filling auxiliary structure one of partially fills and completely fills the first groove.

11. The semiconductor package structure of claim 10, further comprising:
at least one second connection wiring attached to the second semiconductor package, the at least one second connection wiring being over the first sides of the first semiconductor chips and being in contact with the substrate and the second semiconductor chips,
wherein the at least one first connection wiring is partially covered by the second filling auxiliary structure and the at least one second connection wiring is over the first filling auxiliary structure.

12. The semiconductor package structure of claim 11, further comprising:
a third semiconductor package on the second semiconductor package, the third semiconductor package including third semiconductor chips and a third filling auxiliary structure on the second semiconductor package, the third semiconductor chips having a cascade arrangement extending in the same direction as the first direction,
wherein the second and third semiconductor chips define a second groove above the first sides of the first semiconductor chips, and
the third filling auxiliary structure partially covers the at least one second connection wiring and one of partially fills and completely fills the second groove.

13. The semiconductor package structure of claim 12, further comprising:
a filling structure on the substrate,
wherein the first filling auxiliary structure is comprised of one body, the second and third filling auxiliary structures completely fill the first and second grooves, the first filling auxiliary structure contacts along the cascade pattern of the first side of the first semiconductor chips, and the filling structure covers the first to third semiconductor packages.

14. The semiconductor package structure of claim 12, further comprising:
a filling structure on the substrate,
wherein the first filling auxiliary structure is comprised of a plurality of supporting members arranged parallel with respect to the surface of the substrate, the second and third filling auxiliary structures partially fill the first and second grooves, the first filling auxiliary structure partially exposes the cascade shape at the first side of the first semiconductor chips through the plurality of supporting members, and the filling structure fills between the supporting members, the second and third filling auxiliary members, and the first to third semiconductor chips and covers the first to third semiconductor packages.

15. The semiconductor package structure of claim 12, further comprising:
adhesive members over the substrate, the adhesive members being between the substrate and the first to third semiconductor chips,
wherein the adhesive members includes a chemically stable material which is nonreactive to the filling structure and the first to third filling auxiliary structures, and each of the second and the third filling auxiliary structures includes at least one supporting member.

16. A semiconductor package structure, comprising:
a substrate;
a first filling auxiliary structure on the substrate;
first semiconductor chips stacked offset on the substrate, an exposed bottom surfaces of the first semiconductor chips being in contact with the first filling auxiliary structure; and
a filling structure covering the first filling auxiliary structure and first semiconductor chips; a second semiconductor chips stacked offset on the first semiconductor chips, the second semiconductor chips stacked in a direction opposite to a direction in which the first semiconductor chips is stacked; and
a second filling auxiliary structure between an exposed top surfaces of the first semiconductor chips and an exposed bottom surfaces of the second semiconductor chips,
wherein the exposed top surfaces of the first semiconductor chips and the exposed bottom surfaces of the second semiconductor chips are in contact with the second filling auxiliary structure.

17. The semiconductor package structure of claim 16, wherein each of the first semiconductor chips includes a first side near the exposed bottom surface and a second side being opposite to the first side, the first side of each of the first semiconductor chips being in contact with the first filling auxiliary structure.

18. The semiconductor package structure of claim 16, wherein a vertical height of the first filling auxiliary structure is substantially same as a total vertical height of the first semiconductor chips.

19. The semiconductor package structure of claim 16, further comprising:
   a first connection wiring at the second sides of the first semiconductor chips, the first connection wiring configured to electrically connect the first semiconductor chips with the substrate.

* * * * *